(12) United States Patent
Jang et al.

(10) Patent No.: US 11,616,144 B2
(45) Date of Patent: Mar. 28, 2023

(54) SEMICONDUCTOR DEVICE

(71) Applicant: SAMSUNG ELECTRONICS CO., LTD., Suwon-si (KR)

(72) Inventors: Sunguk Jang, Hwaseong-si (KR); Sujin Jung, Hwaseong-si (KR); Jinyeong Joe, Suwon-si (KR); Jeongho Yoo, Seongnam-si (KR); Seung Hun Lee, Hwaseong-si (KR); Jongryeol Yoo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 114 days.

(21) Appl. No.: 16/412,796

(22) Filed: May 15, 2019

(65) Prior Publication Data

US 2020/0075764 A1   Mar. 5, 2020

(30) Foreign Application Priority Data

Sep. 5, 2018  (KR) .......................... 10-2018-0105788
Apr. 1, 2019  (KR) .......................... 10-2019-0037884

(51) Int. Cl.
| | | |
|---|---|---|
| *H01L 29/786* | (2006.01) | |
| *H01L 29/78* | (2006.01) | |
| *H01L 29/417* | (2006.01) | |
| *H01L 27/088* | (2006.01) | |
| *H01L 29/08* | (2006.01) | |

(Continued)

(52) U.S. Cl.
CPC ...... *H01L 29/7851* (2013.01); *H01L 27/0886* (2013.01); *H01L 29/0847* (2013.01); *H01L 29/1037* (2013.01); *H01L 29/41791* (2013.01); *H01L 29/66795* (2013.01); *H01L 29/78618* (2013.01)

(58) Field of Classification Search
CPC ... H01L 29/66795–66818; H01L 29/785–792; H01L 29/823431; H01L 29/823821; H01L 27/0886; H01L 29/165; H01L 29/0847; H01L 29/205; H01L 29/7606; H01L 29/1037; H01L 29/41791; H01L 29/78618

See application file for complete search history.

(56) References Cited

U.S. PATENT DOCUMENTS

| | | |
|---|---|---|
| 8,362,575 B2 | 1/2013 | Kwok et al. |
| 8,841,701 B2 | 9/2014 | Lin et al. |
| 9,397,006 B1 * | 7/2016 | Ok .................... H01L 27/0886 |

(Continued)

FOREIGN PATENT DOCUMENTS

CN         107039507 A        8/2017

*Primary Examiner* — Eric K Ashbahian
(74) *Attorney, Agent, or Firm* — Lee IP Law, P.C.

(57) ABSTRACT

A semiconductor device includes a first active fin protruding from a substrate, a first gate pattern covering a side surface and a top surface of the first active fin, and first source/drain patterns at opposite sides of the first gate pattern, each of the first source/drain patterns including a first lower side and a second lower side spaced apart from each other, a first upper side extended from the first lower side, a second upper side extended from the second lower side. The first lower side may be inclined at a first angle relative to a top surface of the substrate, the second upper side may be inclined at a second angle relative to the top surface of the substrate, and the first angle may be greater than the second angle.

15 Claims, 27 Drawing Sheets

(51) Int. Cl.
    *H01L 29/10*       (2006.01)
    *H01L 29/66*       (2006.01)

(56) References Cited

U.S. PATENT DOCUMENTS

| | | | |
|---|---|---|---|
| 9,431,478 | B2 | 8/2016 | Jeong et al. |
| 9,450,047 | B1 | 9/2016 | Liao et al. |
| 9,466,724 | B2 | 10/2016 | Yang et al. |
| 9,679,977 | B2 | 6/2017 | Kim et al. |
| 9,741,717 | B1* | 8/2017 | Cheng ............... H01L 29/7851 |
| 10,297,601 | B2 | 5/2019 | Kim et al. |
| 2014/0203370 | A1* | 7/2014 | Maeda ............ H01L 29/66795 |
| | | | 257/365 |
| 2014/0252489 | A1* | 9/2014 | Yu .................... H01L 29/785 |
| | | | 257/368 |
| 2016/0064387 | A1* | 3/2016 | Jeong ............... H01L 27/1104 |
| | | | 257/401 |
| 2016/0087053 | A1* | 3/2016 | Kim ................ H01L 29/66545 |
| | | | 257/369 |
| 2016/0111420 | A1 | 4/2016 | Zhang et al. |
| 2016/0343708 | A1 | 11/2016 | Park et al. |
| 2017/0098648 | A1* | 4/2017 | Lee .................. H01L 29/7848 |
| 2017/0103948 | A1 | 4/2017 | Lee et al. |
| 2017/0148797 | A1* | 5/2017 | Kim .................. H01L 23/485 |
| 2017/0271462 | A1* | 9/2017 | Kim ................. H01L 27/0924 |
| 2017/0323888 | A1 | 11/2017 | Li |
| 2020/0058744 | A1* | 2/2020 | Wang ............ H01L 21/823821 |

\* cited by examiner

SEMICONDUCTOR DEVICE

CROSS-REFERENCE TO RELATED APPLICATION

Korean Patent Application Nos. 10-2018-0105788 and 10-2019-0037884, filed on Sep. 5, 2018, and Apr. 1, 2019, respectively, in the Korean Intellectual Property Office, and entitled: "Semiconductor Device," are incorporated by reference herein in their entirety.

BACKGROUND

1. Field

The present disclosure relates to a semiconductor device, and in particular, to a semiconductor device including fin field effect transistors.

2. Description of the Related Art

Due to their small-sized, multifunctional, and/or low-cost characteristics, semiconductor devices are being esteemed as important elements in the electronic industry. The semiconductor devices are classified into memory devices for storing data, logic devices for processing data, and hybrid devices including both of memory and logic elements. To meet the increased demand for electronic devices with fast speed and/or low power consumption, it is necessary to realize semiconductor devices with high reliability, high performance, and/or multiple functions. To satisfy these technical requirements, complexity and/or integration density of semiconductor devices are being increased.

SUMMARY

According to some embodiments, a semiconductor device may include a first active fin protruding from a substrate, a first gate pattern covering a side surface and a top surface of the first active fin, and first source/drain patterns at opposite sides of the first gate pattern, each of the first source/drain patterns including a first lower side and a second lower side spaced apart from each other, a first upper side extended from the first lower side, a second upper side extended from the second lower side. The first lower side may be inclined at a first angle relative to a top surface of the substrate, the second upper side may be inclined at a second angle relative to the top surface of the substrate, and the first angle may be greater than the second angle.

According to some embodiments, a semiconductor device may include a substrate including a first region and a second region, a first active fin protruding from the substrate on the first region, a first source/drain pattern provided on the first active fin, a second active fin protruding from the substrate on the second region, and a second source/drain pattern provided on the second active fin. The largest width of the first source/drain pattern in a first direction may be different from the largest width of the second source/drain pattern in the first direction.

According to some embodiments, a semiconductor device may include a substrate including a first region and a second region, a first active fin protruding from the substrate on the first region, a first source/drain pattern provided on the first active fin, a second active fin protruding from the substrate on the second region, and a second source/drain pattern provided on the second active fin. The first source/drain pattern may have a same shape as the second source/drain pattern, and a size of the first source/drain pattern may be different from that of the second source/drain pattern.

BRIEF DESCRIPTION OF THE DRAWINGS

Features will become apparent to those of skill in the art by describing in detail exemplary embodiments with reference to the attached drawings, in which.

DETAILED DESCRIPTION

Example embodiments will now be described more fully with reference to the accompanying drawings, in which example embodiments are shown.

Figure 1:
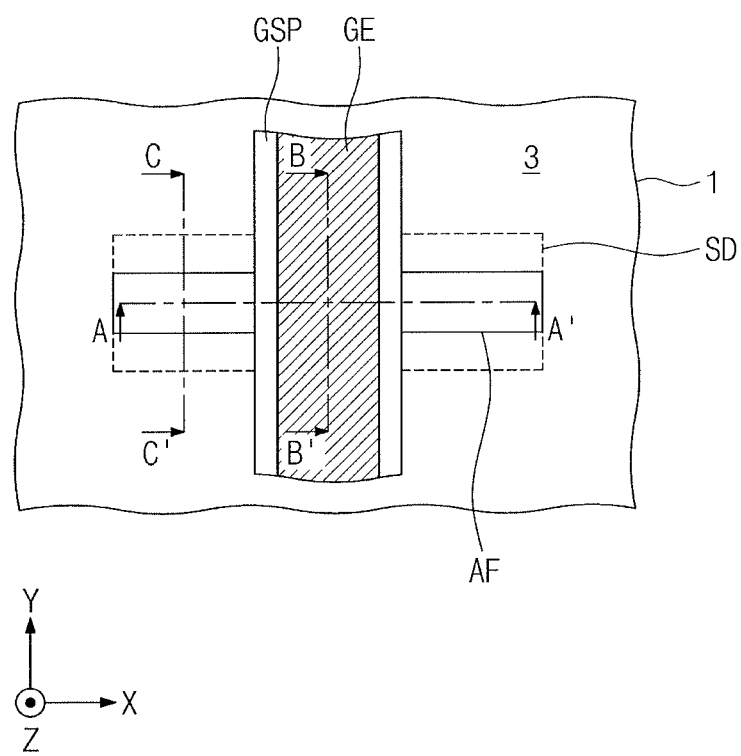
FIG. 1 illustrates a plan view of a semiconductor device according to an embodiment.
Figure 2:
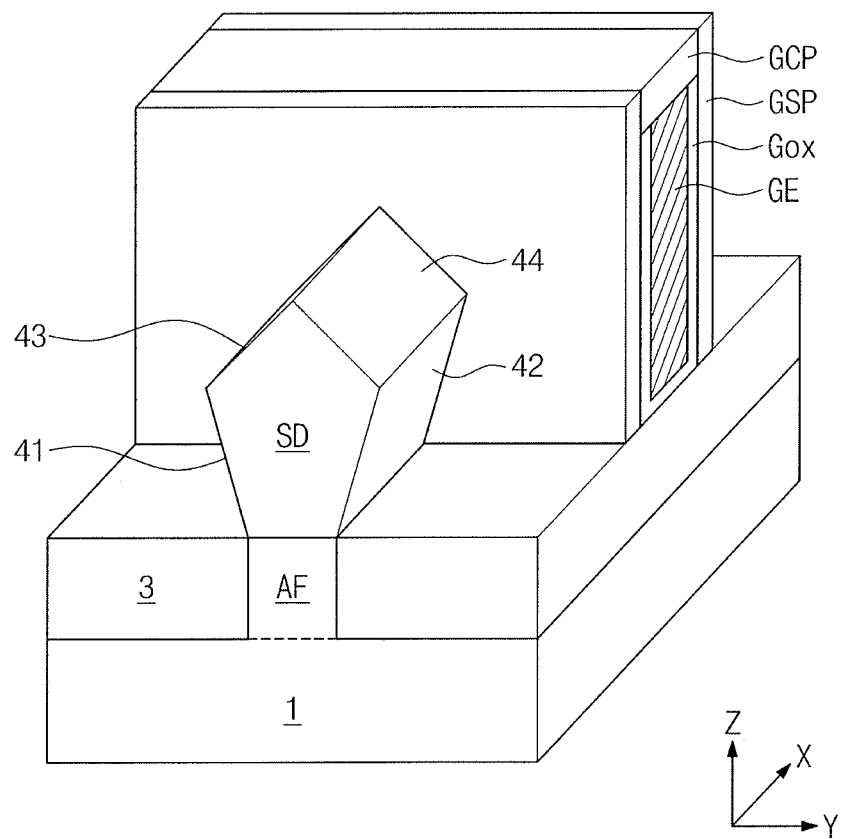
FIG. 2 illustrates a perspective view of the semiconductor device of FIG. 1.
Figure 3:
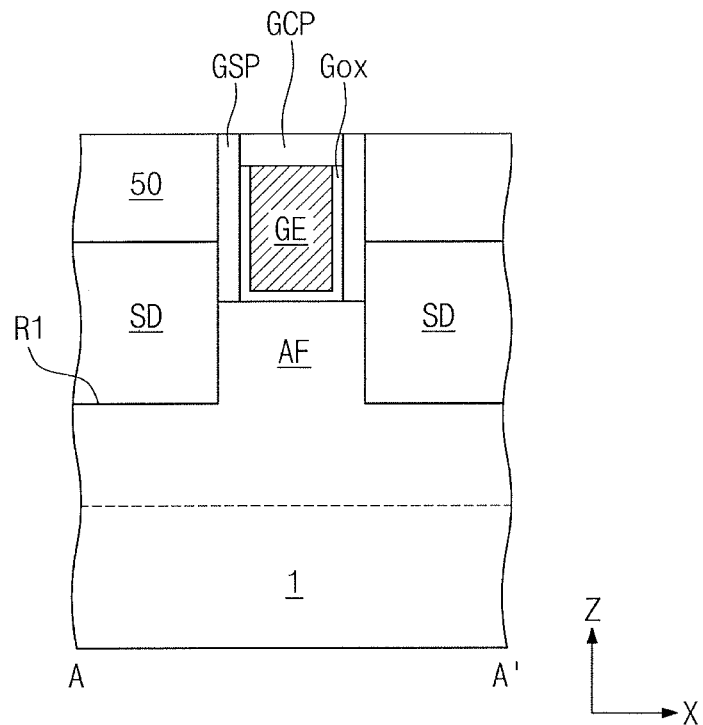
FIGS. 3 and 4 illustrate sectional views respectively taken along lines A-A' and B-B' of FIG. 1.
Figure 4:
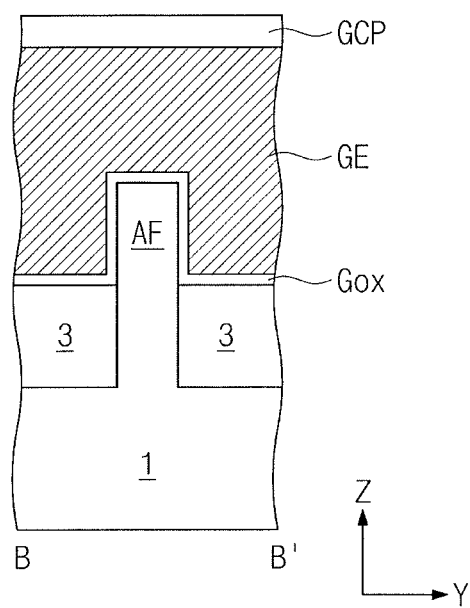
Figure 5:
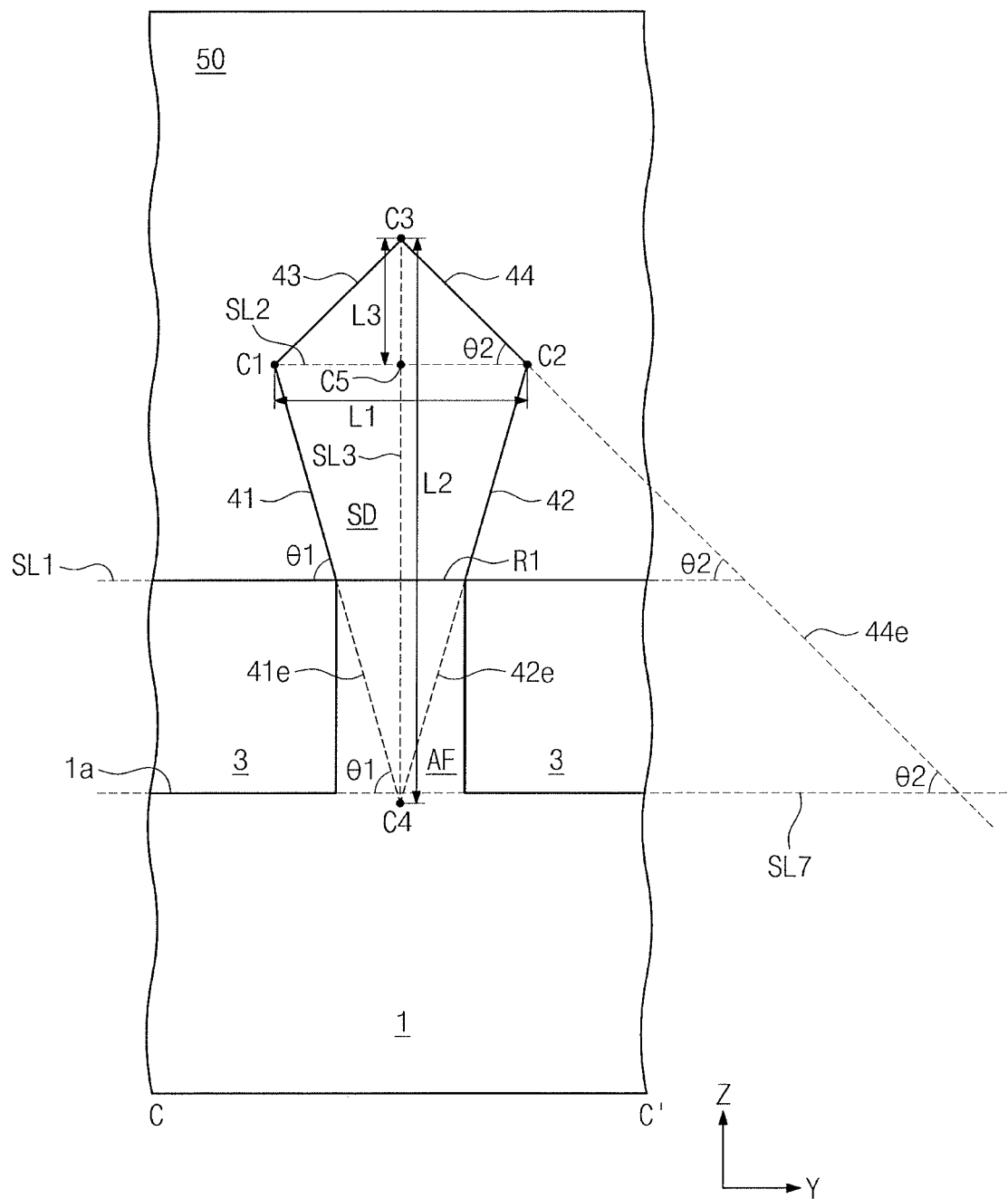
FIG. 5 illustrates an enlarged sectional view taken along line C-C' of FIG. 1.

FIG. 1 is a plan view illustrating a semiconductor device according to an embodiment. FIG. 2 is a perspective view illustrating the semiconductor device of FIG. 1. FIGS. 3 and 4 are sectional views respectively taken along lines A-A' and B-B' of FIG. 1. FIG. 5 is an enlarged sectional view taken along line C-C' of FIG. 1.

Referring to FIGS. 1 to 5, a substrate 1 and an active fin AF protruding from the substrate 1 may be provided. A device isolation layer 3 may be provided on the substrate 1 to enclose the active fin AF. The active fin AF may have a top surface and an upper side surface that are located at a higher level than a top surface of the device isolation layer 3. The substrate 1 may be a single crystalline silicon wafer or a silicon on insulator (SOI) substrate. The device isolation layer 3 may be formed of or include at least one of, e.g., silicon oxide, silicon nitride, or silicon oxynitride and may have a single- or multi-layered structure. The active fin AF may be a bar-shaped or line-shaped pattern elongated in a first direction X. A gate electrode GE may be provided to cross the active fin AF in a second direction Y. The gate electrode GE may include a work function pattern and a metal line pattern.

The work function pattern may be an n-type work function pattern or a p-type work function pattern. The n-type work function pattern may include at least one of, e.g., lanthanum (La), lanthanum oxide (LaO), tantalum (Ta), tantalum nitride (TaN), niobium (Nb), or titanium nitride (TiN). The p-type work function pattern may include at least one of, e.g., aluminum (Al), aluminum oxide ($AlO_x$), titanium nitride (TiN), tungsten nitride (WN), or ruthenium oxide (RuO2). The metal line pattern may include at least one of, e.g., tungsten, copper, or aluminum. The gate electrode GE may further include a diffusion barrier pattern between the work function pattern and the metal line pattern. The diffusion barrier pattern may include a metal nitride layer (e.g., a titanium nitride layer, a tantalum nitride layer, and a tungsten nitride layer).

A gate capping pattern GCP may be provided on the gate electrode GE. A gate spacer GSP may be provided to cover side surfaces of the gate electrode GE and the gate capping pattern GCP. The gate capping pattern GCP may be formed of or include, e.g., a silicon nitride layer. The gate spacer GSP may be formed of or include at least one of, e.g., silicon oxide, silicon nitride, or silicon oxynitride, and may have a single- or multi-layered structure. A gate insulating layer Gox may be interposed between the active fin AF and the gate electrode GE. The gate insulating layer Gox may be interposed between the gate spacer GSP and the gate electrode GE. The gate insulating layer Gox may include, e.g., a silicon oxide layer. In certain embodiments, the gate insulating layer Gox may further include a high-k dielectric material whose dielectric constant is higher than that of the silicon oxide layer. The high-k dielectric material may include at least one of, e.g., hafnium oxide ($HfO_2$), hafnium silicate (HfSiO), hafnium oxynitride (HfON), hafnium silicon oxynitride (HfSiON), hafnium aluminum oxide ($HfAlO_3$), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide ($TiO_2$), barium strontium titanium oxide (BaSrTiO), barium titanium oxide (BaTiO), strontium titanium oxide (SrTiO), yttrium oxide (YO), aluminum oxide ($Al_2O_3$), tantalum oxide ($Ta_2O_3$), or lead scandium tantalum oxide (PbScTaO).

A recessed region R1 may be formed in the active fin AF and beside the gate spacer GSP. A source/drain pattern SD may be provided in the recessed region R1. The source/drain pattern SD may be an epitaxial layer, which is formed of the same material as the substrate 1. For example, the source/drain pattern SD may be a silicon epitaxial layer. The source/drain pattern SD may further include a material different from the substrate 1. For example, the source/drain pattern SD may be a silicon germanium epitaxial layer. The source/drain pattern SD may be doped with n-type or p-type impurities. For example, the source/drain pattern SD may be doped with phosphorus or boron. The source/drain pattern SD may be covered with an interlayered insulating layer 50. The interlayered insulating layer 50 may be formed of or include at least one of, e.g., silicon oxide, silicon nitride, silicon oxynitride, or porous insulating materials and may have a single- or multi-layered structure.

Hereinafter, the source/drain pattern SD will be described in more detail with reference to FIG. 5. The source/drain pattern SD may include a first lower side 41 and a second lower side 42, which are spaced apart from each other, a first upper side 43, which is extended from a top end of the first lower side 41, and a second upper side 44, which is extended from the second lower side 42. For example, as illustrated in FIG. 5, a cross-section of the source/drain pattern SD may have a pentagonal shape having a flat bottom on the top surface of the active fin AF, first and second lower sides 41 and 42 extending upwardly from the bottom and away from each other, and first and second upper sides 43 and 44 extending upwardly from the first and second lower sides 41 and 42, respectively, to contact each other. For example, as illustrated in FIG. 5, the pentagonal shape of the source/drain pattern SD may be symmetrical with respect to its central axis along the Z direction. For example, as illustrated in FIG. 5, a height of the pentagonal shape may asymmetric, so a top of the source/drain pattern SD may be not flat, i.e., with a sharp edge pointing upward and away from the substrate 1.

In detail, the first lower side 41 may be inclined at a first angle $\theta 1$ relative to a first line SL1, which connects bottom ends of the first and second lower sides 41 and 42 and is outwardly extended. Hereinafter, a point where the first lower side 41 and the first upper side 43 meet will be referred to as a first point C1, and a point where the second lower side 42 and the second upper side 44 meet will be referred to as a second point C2. A second segment SL2 (or a second line SL2) connecting the first point C1 to the second point C2 (dashed horizontal line in FIG. 5) may be, e.g., parallel to a top surface of the substrate 1, and at a second angle $\theta 2$ relative to the second upper side 44. For example, as illustrated in FIG. 5, the second segment SL2, i.e., a distance connecting the first and second points C1 and C2, may be the widest part of the source/drain pattern SD along the Y direction. That is, a distance between the first and second lower sides 41 and 42 along the Y direction may decrease as a distance from the second segment SL2 increases. Similarly, a distance between the first and second upper sides 43 and 44 along the Y direction may decrease as a distance from the second segment SL2 increases.

The first angle $\theta 1$ may be defined as a slope of the second lower side 42 relative to a top surface of the substrate 1. For example, as illustrated in FIG. 5, the first and second lower sides 41 and 42 may be inclined away from each other, so the first angle $\theta 1$ may be an acute angle. The second angle $\theta 2$ may be defined as a slope of the first upper side 43 relative to the top surface of the substrate 1. Here, the first angle $\theta 1$ may be greater than the second angle $\theta 2$. In some embodiments, the first angle $\theta 1$ may range from about 55° to about 65°.

The first line SL1 and the second line SL2 may be parallel to each other. The first line SL1 and the second line SL2 may be parallel to a top surface 1a of the substrate 1. The first angle θ1 may correspond to an angle between an extension line 41e of the first lower side 31 and a seventh line SL7, which is an extension line of the top surface 1a of the substrate 1. In other words, the first angle θ1 may correspond to an angle between the first lower side 31 and the top surface 1a of the substrate 1. The second angle θ2 may correspond to an angle between an extension line 44e of the second upper side 44 and the first line SL1. The second angle θ2 may correspond to an angle between the extension line 44e of the second upper side 44 and the seventh line SL7. In other words, the second angle θ2 may correspond to an angle between the second upper side 44 and the top surface 1a of the substrate 1.

In detail, the second segment SL2 may have a first length L1, e.g., in the Y direction. The first upper side 43 and the second upper side 44 facing each other may be inclined toward each other and meet at a third point C3. An extension line 41e of the first lower side 41 may meet an extension line 42e of the second lower side 42 at a fourth point C4, and the fourth point C4 and the third point C3 may be connected by a third segment SL3 (or a third line SL3). The third segment SL3 may have a second length L2, e.g., in the Z direction. The second segment SL2 and the third segment SL3 may intersect each other at a fifth point C5, which is located at a higher level than a center point of the third segment SL3, e.g., along the Z direction, relative to the bottom of the substrate. Therefore, a distance L3 (hereinafter, a third length) from the third point C3 to the fifth point C5 is shorter than half the second length L2. For example, the distance L3 may be about 0.2 to about 0.45 times the second length L2.

As an integration density of a semiconductor device increases, a distance between source/drain patterns of PMOS and NMOS transistors adjacent to each other decreases, thereby increasing bridge or short risk between the PMOS and NMOS transistors adjacent to each other. However, according to some embodiments, the source/drain pattern SD may have a relatively small width (e.g., the first length L1) in the second direction Y, since the first angle θ1 is greater than the second angle θ2. Accordingly, it may be possible to reduce the bridge or short risk between different types of source/drain patterns, which are located adjacent to each other.

FIGS. 6, 7, 8A, 9, and 10 are sectional views illustrating a process of fabricating a semiconductor device, which has vertical sections shown in FIGS. 3, 4 and 5. FIG. 8B is a diagram illustrating a change in surface profile of a portion 'P1' of FIG. 8A, according to some embodiments.

Figure 6:
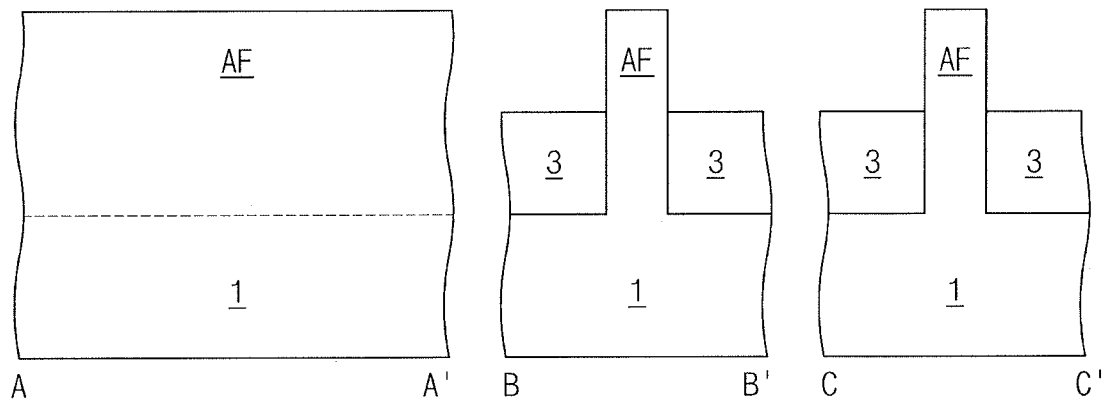
FIGS. 6, 7, 8A, 9, and 10 illustrate sectional views of stages in a process of fabricating a semiconductor device, which has vertical sections shown in FIGS. 3-5.

Referring to FIGS. 1 and 6, the substrate 1 may be patterned to form the active fin AF. The device isolation layer 3 may be formed on the substrate 1 and may be etched to expose a top surface and upper side surfaces of the active fin AF. For example, the device isolation layer 3 may be etched to have a top surface lower than a top surface of the active fin AF. The substrate 1 may be a single crystalline silicon wafer or an SOI substrate. The device isolation layer 3 may be formed of or include at least one of, e.g., silicon oxide, silicon nitride, or silicon oxynitride and may have a single- or multi-layered structure.

Figure 7:
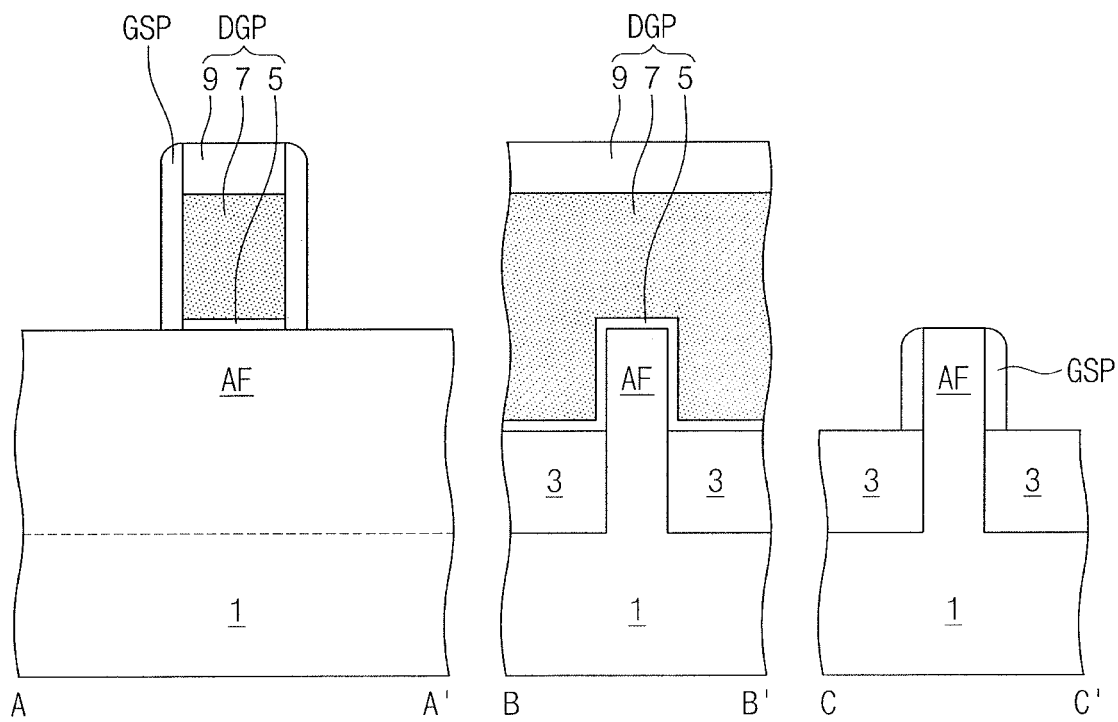
Figure 8A:
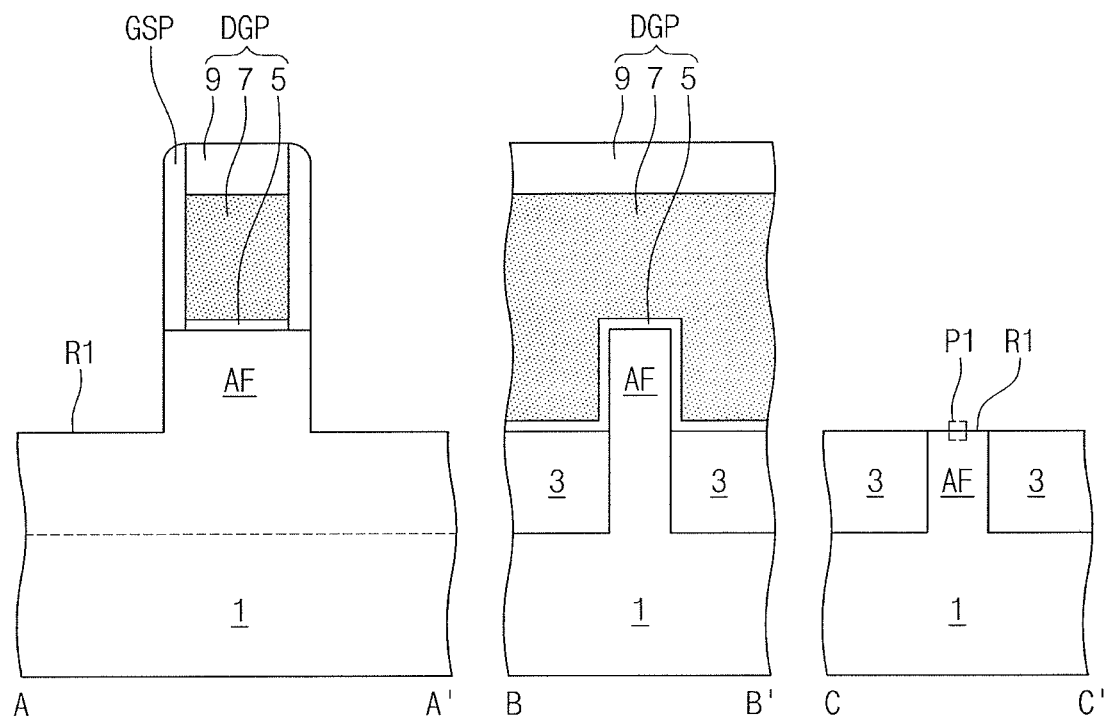
Figure 8B:
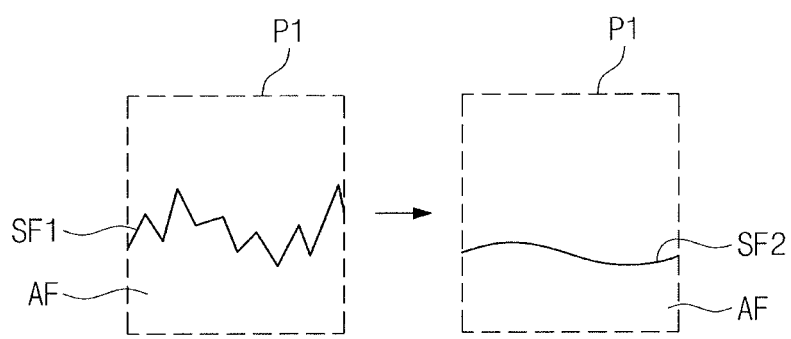
FIG. 8B illustrates a diagram of a change in surface profile of a portion 'P1' of FIG. 8A, according to some embodiments.

Referring to FIGS. 1 and 7, a dummy gate pattern DGP may be formed to cross the active fin AF. The dummy gate pattern DGP may be formed by sequentially stacking a dummy gate insulating layer 5, a dummy gate layer 7, and a dummy gate capping layer 9 and patterning them. The dummy gate pattern DGP may be formed at a position of the gate electrode GE of FIG. 1. The active fin AF may be exposed at both sides of the dummy gate pattern DGP. A spacer layer may be conformally formed on the substrate 1 and may be anisotropically etched to form the gate spacer GSP. In some embodiments, the gate spacer GSP may be formed to cover side surfaces of the active fin AF exposed at both sides of the dummy gate pattern DGP. The dummy gate insulating layer 5 may be formed of or include, e.g., a silicon oxide layer. The dummy gate layer 7 may be formed of or include, e.g., a poly-silicon layer. The dummy gate capping layer 9 may be formed of or include, e.g., a silicon nitride layer.

Referring to FIGS. 1, 7, 8A, and 8B, an etching process may be performed to partially remove the active fin AF exposed at both sides of the dummy gate pattern DGP, and as a result, the recessed region R1 may be formed in the active fin AF. Here, the gate spacer GSP covering the side surface of the active fin AF may also be etched. The etching process may be an anisotropic etching process. The anisotropic etching process may cause an increase in roughness of a surface SF1 of the recessed region R1. According to some embodiments, the rough surface SF1 of the recessed region R1 may be changed to a smooth surface SF2. This surface treatment may be achieved by additionally performing an isotropic etching process or a cleaning process and/or by depositing an epitaxial seed layer for forming the source/drain pattern. The epitaxial seed layer may be, e.g., a silicon epitaxial layer.

Referring to FIGS. 5, 8A, 8B, and 9, after the surface treatment for realizing the smooth surface SF2 of the recessed region R1, the source/drain pattern SD may be formed using, e.g., a selective epitaxial growth (SEG) process. The source/drain pattern SD grown on the smooth surface SF2 may have a (111) plane having a growth angle that is equal to the first angle θ1 of FIG. 5. In other words, the first angle θ1 may range from about 55° to about 65°. Accordingly, the source/drain pattern SD may have the same shape as that described with reference to FIG. 5.

Figure 9:
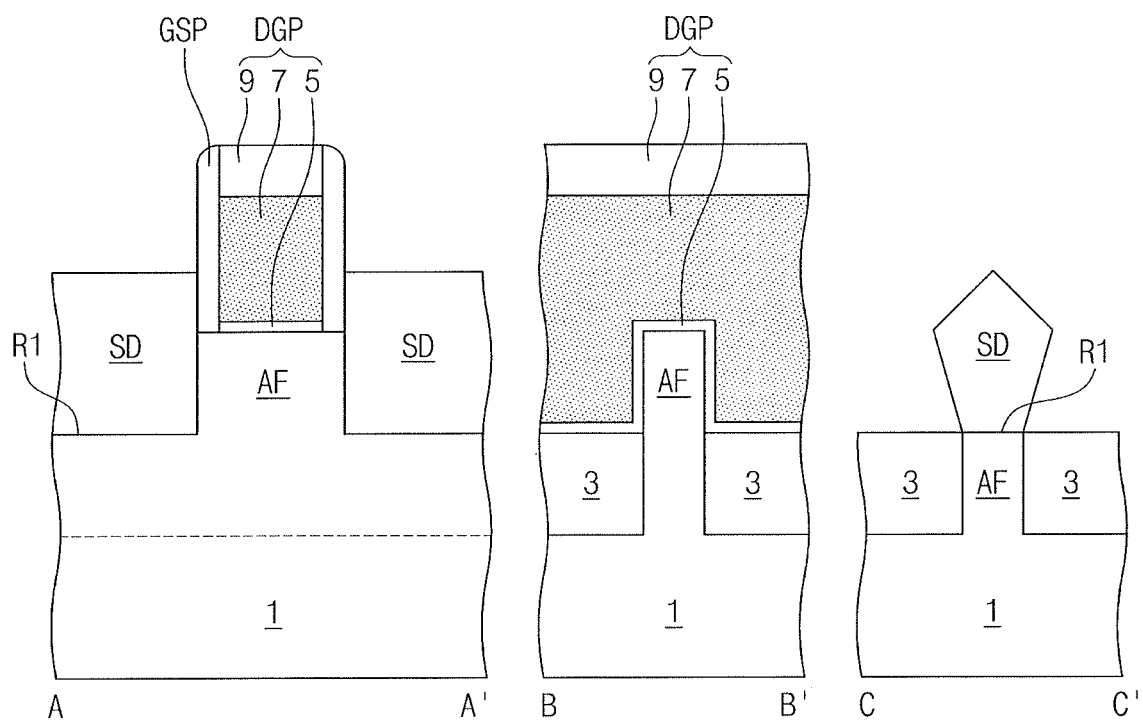
Figure 10:
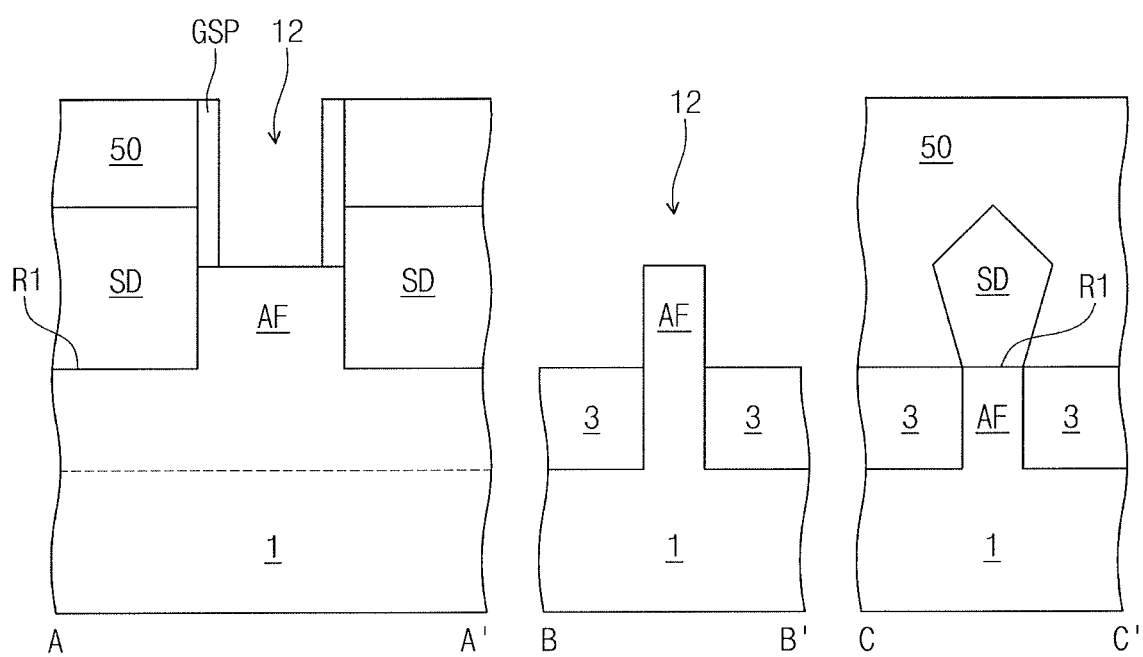

Referring to FIGS. 9 and 10, the interlayered insulating layer 50 may be formed on the substrate 1, and then, a chemical mechanical polishing (CMP) process may be performed to expose a top surface of the dummy gate pattern DGP. Next, the dummy gate pattern DGP may be removed, and as a result, a groove 12 may be formed between inner side surfaces of the gate spacer GSP to expose the active fin AF.

Referring to FIGS. 3 to 5 and 10, the gate insulating layer Gox and a gate electrode layer may be sequentially formed on the substrate 1 to fill the groove 12, and then, an etch-back process may be performed to form the gate electrode GE in the groove 12. Thereafter, the gate capping pattern GCP may be formed on the gate electrode GE.

FIGS. 11 to 14 are sectional views, each of which is taken along a line C-C' of FIG. 1 to illustrate a semiconductor device according to an embodiment.

Figure 11:
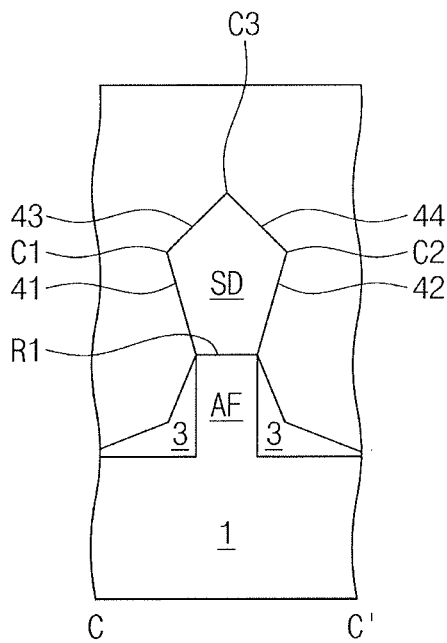
FIGS. 11 to 14 illustrate sectional views, each of which is taken along line C-C' of FIG. 1, of semiconductor devices according to embodiments.

Referring to FIG. 11, when viewed in the C-C' section, the top surface of the device isolation layer 3 may be recessed. For example, as compared to the embodiment in FIG. 8A, an upper portion of the device isolation layer 3 may be etched to form a recessed top surface (rather than a surface level with the bottom of the recessed region R1). Here, the source/drain pattern SD may have the same shape as that described with reference to FIG. 5.

Figure 12:
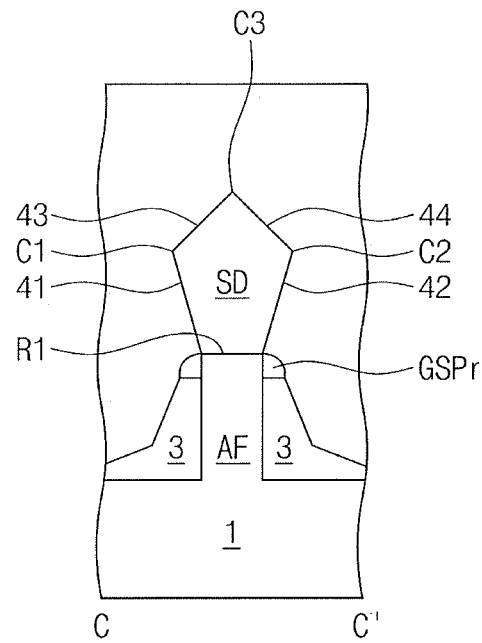

Referring to FIG. 12, when viewed in the C-C' section, a portion of the gate spacer GSP may remain on the side surface of the active fin AF. For example, the side surface of the active fin AF below the recessed region R1 may be covered with a remaining gate spacer GSPr. A bottom surface of the recessed region R1 may be higher than the top surface of the device isolation layer 3. A top end of the remaining gate spacer GSPr may be located at the same level as the bottom surface of the recessed region R1. Here, the source/drain pattern SD may be formed to have the same shape as that described with reference to FIG. 5. However, the third point C3 of the source/drain pattern SD may be higher than the third point C3 of FIG. 5. In this case, bottom ends of the first and second lower sides 41 and 42 of the source/drain pattern SD may be located at the same level as the top end of the remaining gate spacer GSPr.

Figure 13:
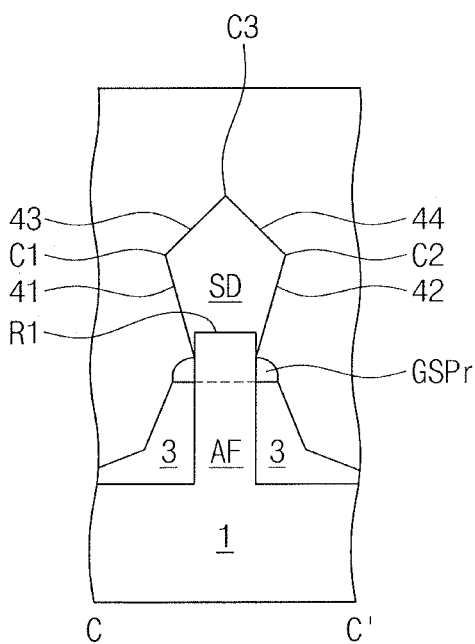

In certain embodiments, as shown in FIG. 13, the top end of the remaining gate spacer GSPr may be lower than the bottom surface of the recessed region R1. The side surface of the active fin AF below the bottom surface of the recessed region R1 may be partially covered with the source/drain pattern SD. The bottom ends of the first and second lower sides 41 and 42 of the source/drain pattern SD may be located at the same level as the top end of the remaining gate spacer GSPr. The active fin AF may include a portion that is extended or inserted into the source/drain pattern SD. Other elements may be substantially the same as those of FIG. 12.

Figure 14:
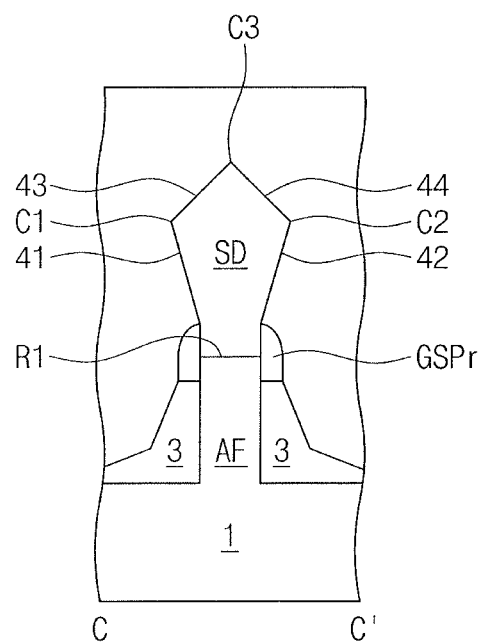

In certain embodiments, as shown in FIG. 14, the top end of the remaining gate spacer GSPr may be higher than the bottom surface of the recessed region R1. The source/drain pattern SD may include a lower portion, which is extended between the remaining gate spacers GSPr and is in contact with the active fin AF. The lower portion of the source/drain pattern SD may be covered with the remaining gate spacers GSPr. In the present embodiments, the bottom ends of the first and second lower sides 41 and 42 of the source/drain pattern SD may be located at the same level as the top end of the remaining gate spacer GSPr. Other elements may be substantially the same as those of FIG. 12.

Figure 15:
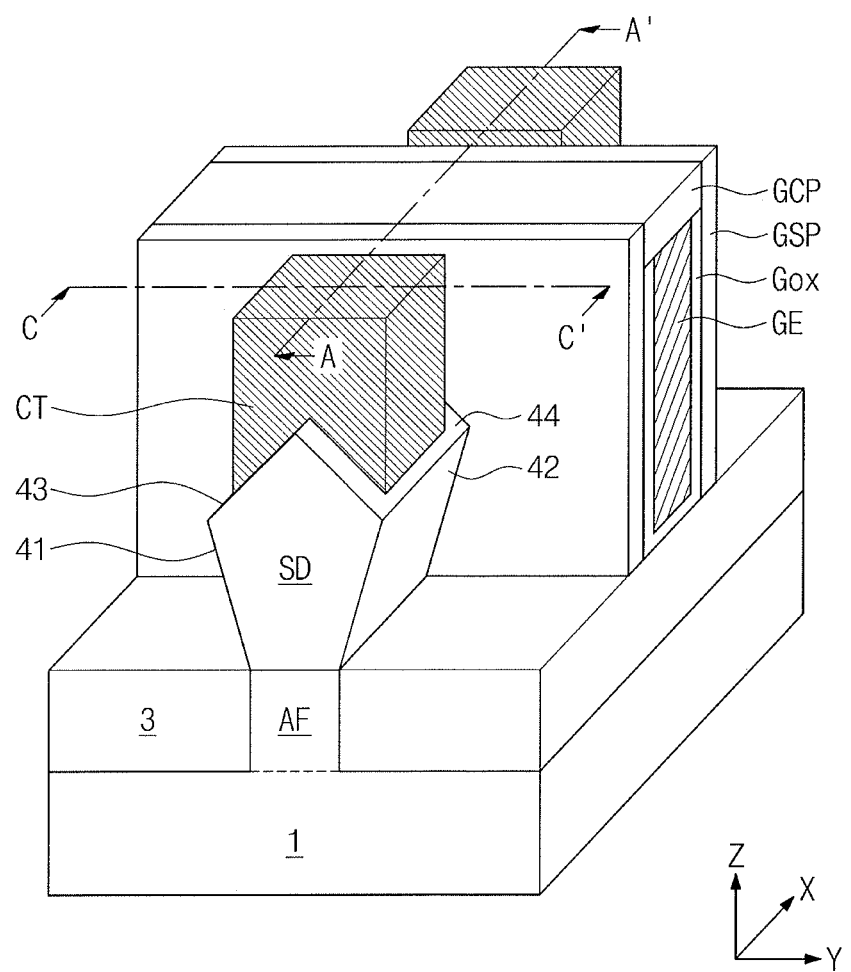
FIG. 15 illustrates a perspective, view of a semiconductor device according to an embodiment.
Figure 16:
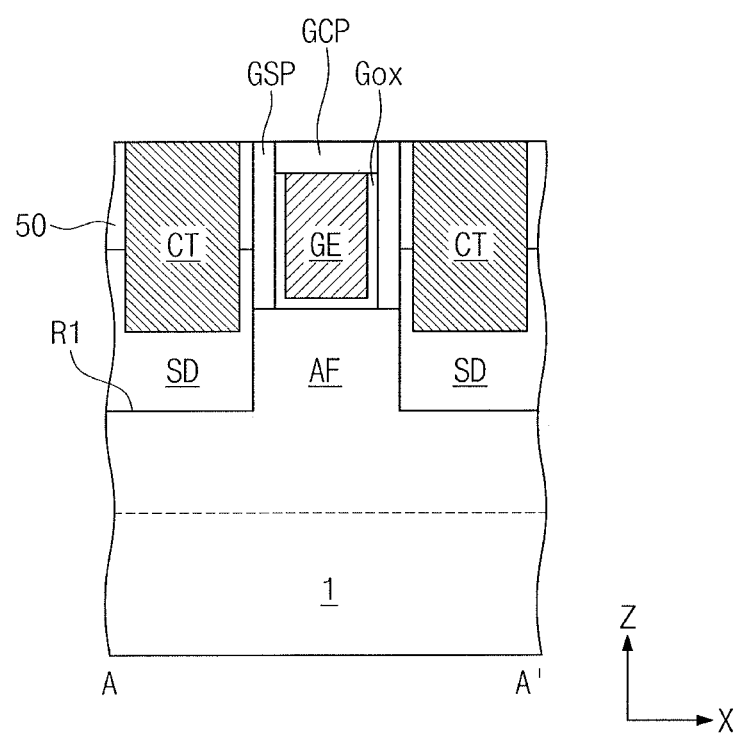
FIG. 16 illustrates a sectional view taken along line A-A' of FIG. 15.
Figure 17:
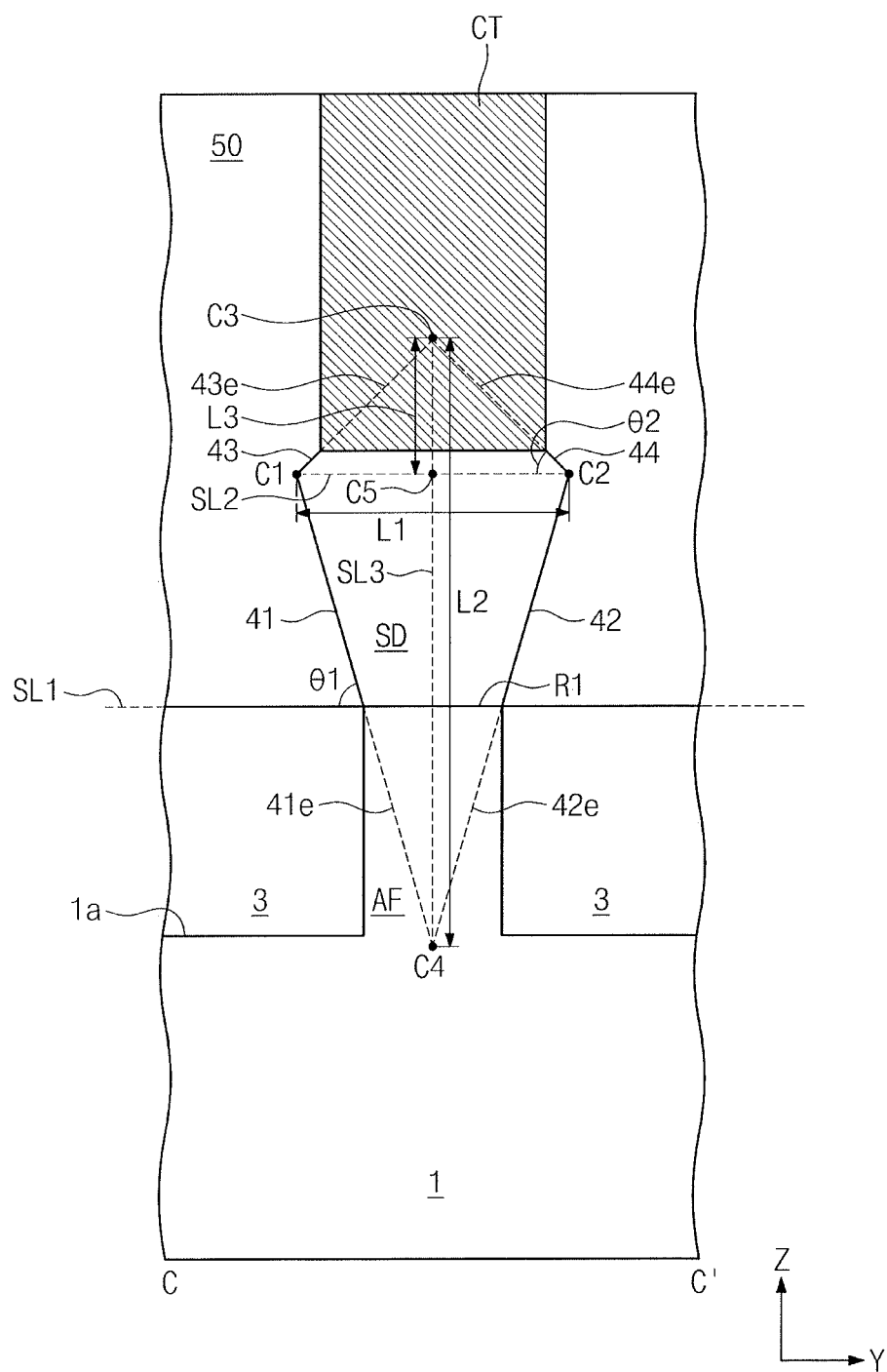
FIG. 17 illustrates a sectional view taken along line C-C' of FIG. 15.

FIG. 15 is a perspective view illustrating a semiconductor device according to an embodiment. FIG. 16 is a sectional view taken along a line A-A' of FIG. 15. FIG. 17 is a sectional view taken along a line C-C' of FIG. 15.

Referring to FIGS. 15 to 17, a contact plug CT may be formed on the semiconductor device described with reference to FIGS. 2 to 5. The formation of the contact plug CT may include removing upper portions of the interlayered insulating layer 50 and the source/drain pattern SD to form a contact hole and filling the contact hole with a conductive layer. Here, a bottom surface of the contact plug CT may be higher than the fifth point C5. Top end portions of the first and second upper sides 43 and 44 of the source/drain pattern SD may be partially removed during the formation of the contact plug CT. In this case, as shown in FIG. 17, the third point C3 may be located at a point where an extension line 43e of a remaining portion of the first upper side 43 meets an extension line 44e of a remaining portion of the second upper side 44. A width of the contact plug CT in the first direction X may be smaller than a width of the source/drain pattern SD in the first direction X. Thus, the highest point (e.g., the third point C3 of FIG. 5) of the source/drain pattern SD may be located beside the contact plug CT, e.g., at a sharp point of the intersection of the first and second upper sides 43 and 44 of the source/drain pattern SD outside the contact plug CT (FIG. 15). Other elements may be substantially the same as those of FIG. 5.

Figure 18:
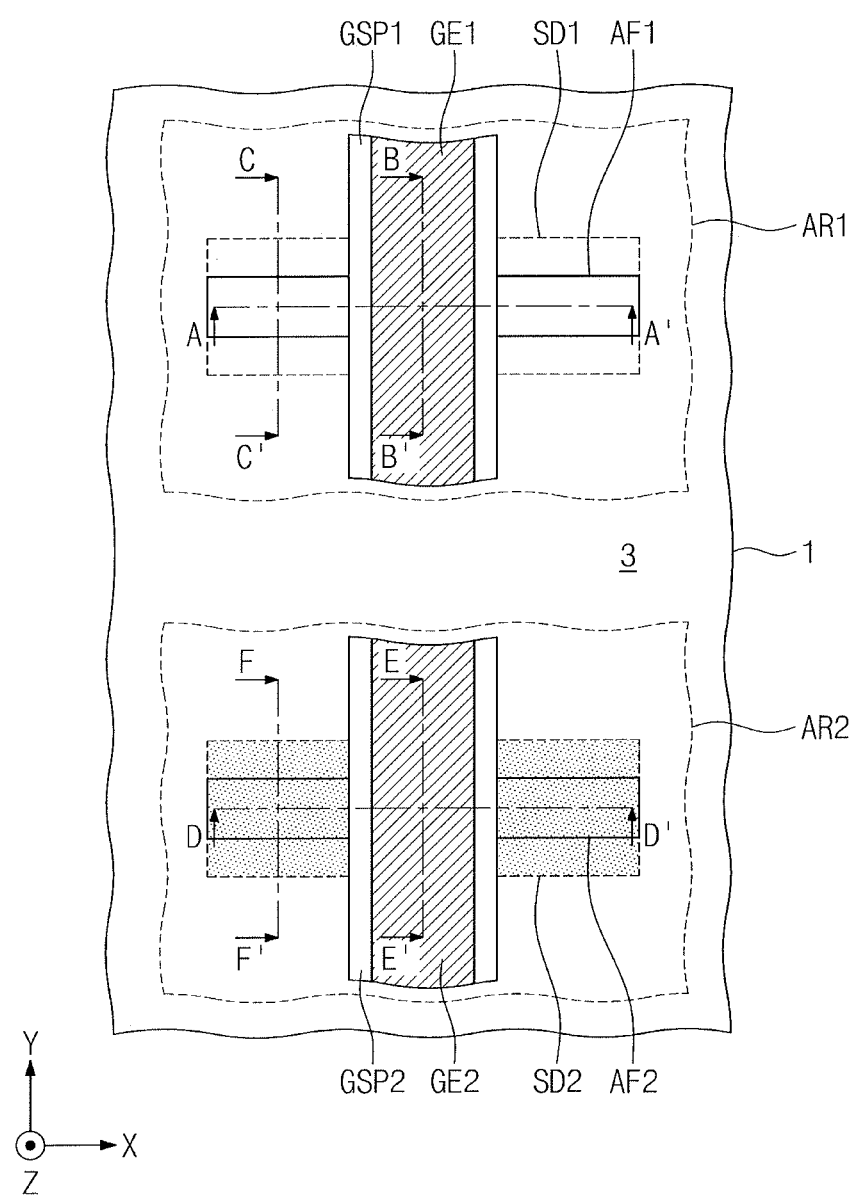
FIG. 18 illustrates a plan view of a semiconductor device according to an embodiment.
Figure 19:
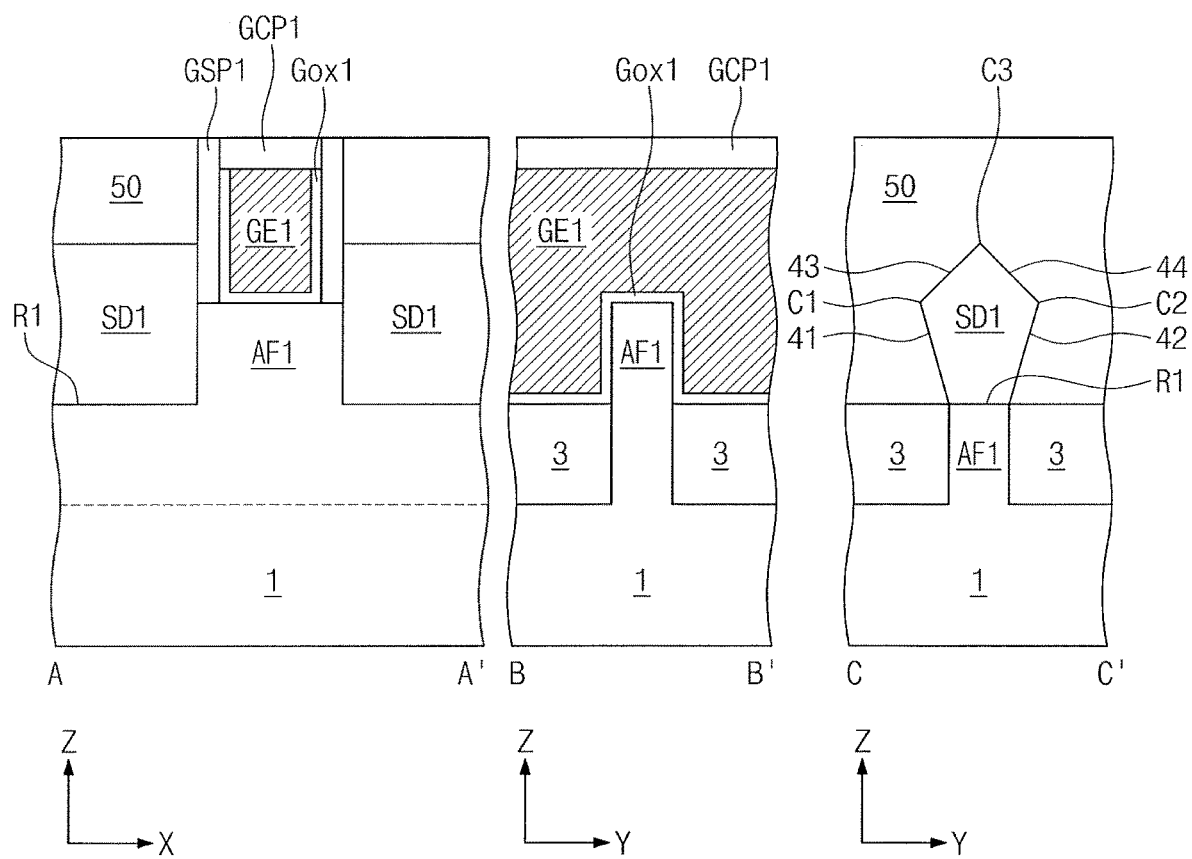
FIG. 19 illustrates a sectional view of vertical sections along lines A-A', B-B', and C-C' of FIG. 18.
Figure 20:
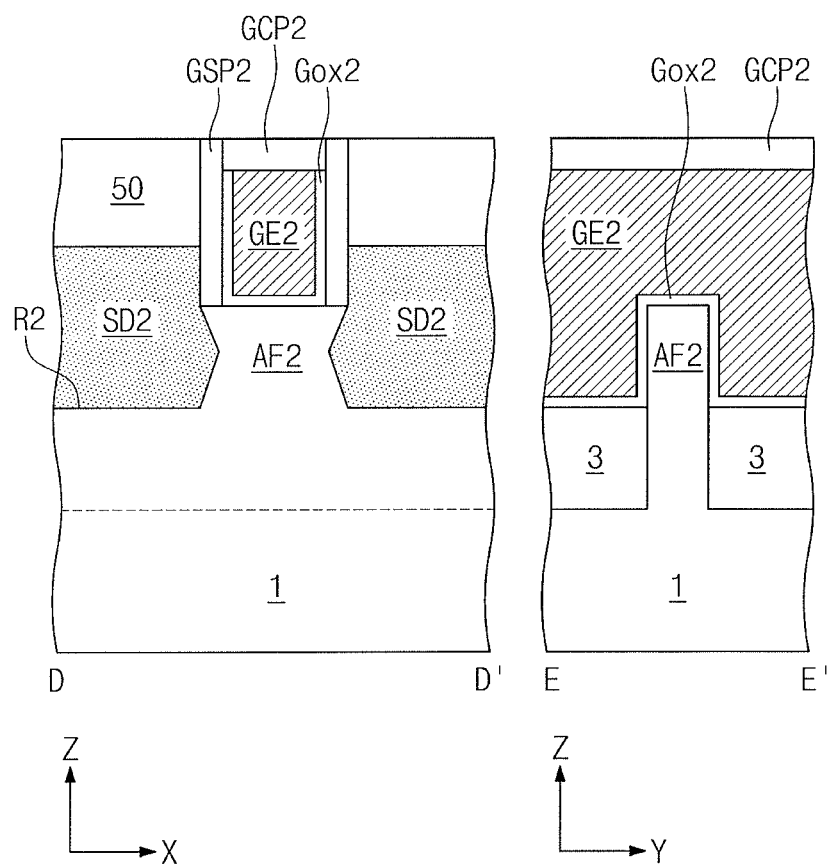
FIG. 20 illustrates a sectional view of vertical sections along lines D-D' and E-E' of FIG. 18.
Figure 21:
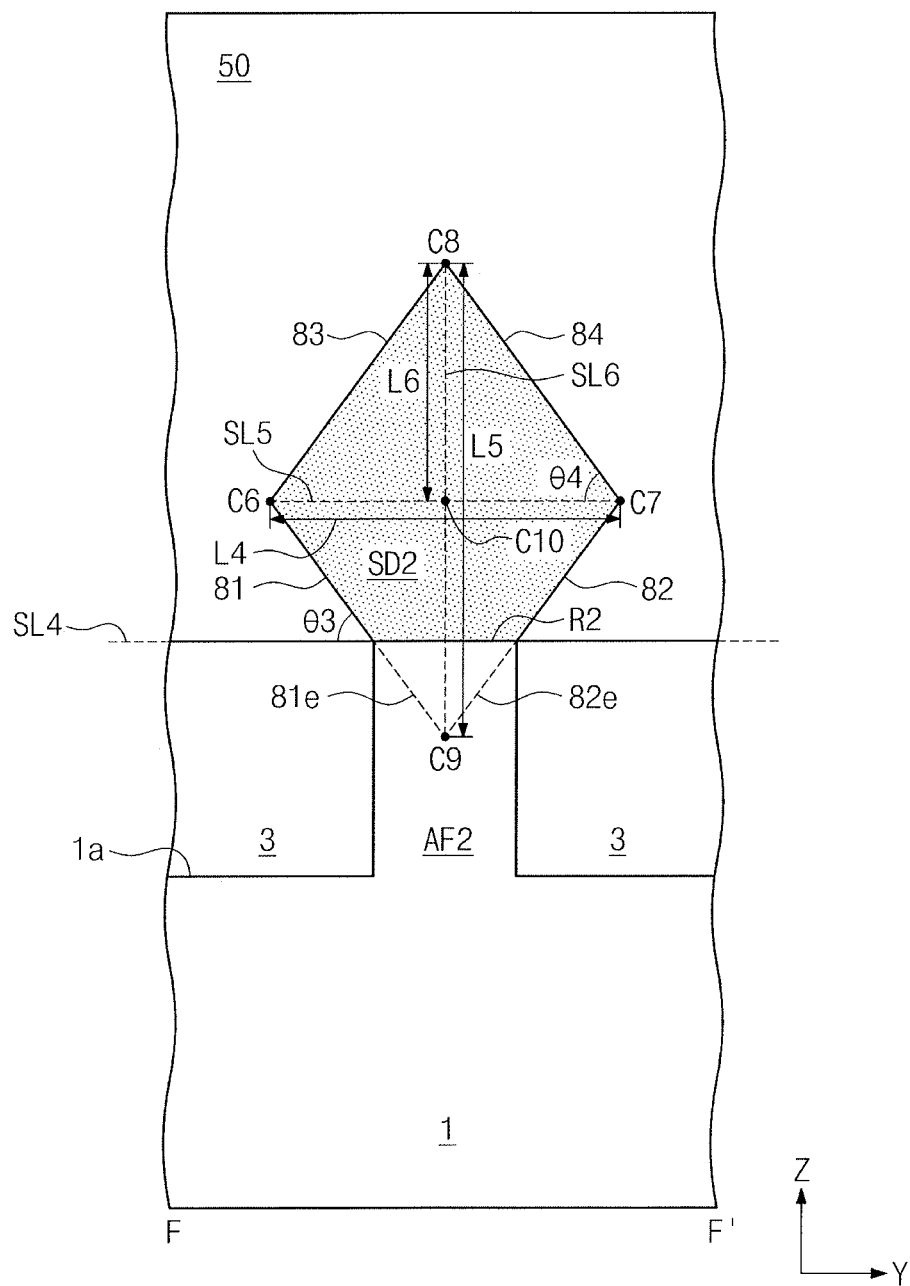
FIG. 21 illustrates an enlarged sectional view along line F-F' of FIG. 18.

FIG. 18 is a plan view illustrating a semiconductor device according to an embodiment. FIG. 19 is a sectional view illustrating vertical sections taken along lines A-A', B-B', and C-C' of FIG. 18. FIG. 20 is a sectional view illustrating vertical sections taken along lines D-D' and E-E' of FIG. 18. FIG. 21 is an enlarged sectional view taken along a line F-F' of FIG. 18.

Referring to FIGS. 18 to 21, the substrate 1 may include a first region AR1 and a second region AR2. The first region AR1 may be an NMOS transistor region. A first active fin AF1 protruding from the substrate 1 may be provided in the first region AR1. A first gate electrode GE1 may be provided on the first active fin AF1. A first gate capping pattern GCP1 may be provided on the first gate electrode GE1. Side surfaces of the first gate electrode GE1 and the first gate capping pattern GCP1 may be covered with a first gate spacer GSP1. A first gate insulating layer Gox1 may be interposed between the first gate electrode GE1 and the first active fin AF1. The first gate insulating layer Gox1 may be interposed between the first gate electrode GE1 and the first gate spacer GSP1. The first recessed region R1 may be provided on the first active fin AF1 and at both sides of the first gate electrode GE1. A first source/drain pattern SD1 may be provided in the first recessed region R1. The first source/drain pattern SD1 may have the shape described with reference to FIG. 5. The first source/drain pattern SD1 may have one of the shapes described with reference to FIGS. 11 to 14.

The second region AR2 may be a PMOS transistor region. A second active fin AF2 protruding from the substrate 1 may be provided in the second region AR2. A second gate electrode GE2 may be provided on the second active fin AF2. A second gate capping pattern GCP2 may be provided on the second gate electrode GE2. Side surfaces of the second gate electrode GE2 and the second gate capping pattern GCP2 may be covered with a second gate spacer GSP2. A second gate insulating layer Gox2 may be interposed between the second gate electrode GE2 and the second active fin AF2. The second gate insulating layer Gox2 may be interposed between the second gate electrode GE2 and the second gate spacer GSP2. A second recessed region R2 may be provided on the second active fin AF2 and at both sides of the second gate electrode GE2. A second source/drain pattern SD2 may be provided in the second recessed region R2.

In the D-D' section of FIG. 20, the second active fin AF2 below the second gate electrode GE2 may have a non-uniform width. For example, below the second gate electrode GE2, a width of a top surface of the second active fin AF2 may be greater than a width of an intermediate portion of the second active fin AF2. In addition, a width of the second active fin AF2 at the bottom level of the second recessed region R2 may be greater than the width of the intermediate portion of the second active fin AF2. In other words, the side surface of the second active fin AF2 below the second gate electrode GE2 may be recessed to have a concave shape.

Referring to FIG. 21, the second source/drain pattern SD2 may include a third lower side 81 and a fourth lower side 82, which are spaced apart from each other, a third upper side 83, which is extended from a top end of the third lower side 81, and a fourth upper side 84, which is extended from the fourth lower side 82. The third lower side 81 may be inclined at a third angle θ3 relative to a fourth line SL4, which connects a bottom end of the third lower side 81 to a bottom end of the fourth lower side 82 and is outward extended. Hereinafter, a point where the third lower side 81 and the third upper side 83 meet will be referred to as a sixth point C6, and a point where the fourth lower side 82 and the fourth upper side 84 meet will be referred to as a seventh point C7. A fifth segment SL5 (or a fifth line SL5) connecting the sixth point C6 to the seventh point C7 may be inclined to a fourth angle θ4 relative to the fourth upper side 84. Here, the third angle θ3 may be smaller than the first angle θ1 of FIG. 5. The third angle θ3 may be substantially equal to the fourth angle θ4. In some embodiments, the third angle θ3 may be about 54.2°.

The fourth line SL4 and the fifth line SL5 may be parallel to each other. The fourth line SL4 and the fifth line SL5 may be parallel to the top surface 1a of the substrate 1. The third angle θ3 may correspond to an angle between the third lower side 81 and the top surface 1a of the substrate 1. The fourth angle θ4 may correspond to an angle between the fourth upper side 84 and the top surface 1a of the substrate 1.

The fifth segment SL5 may have a fourth length L4. The third upper side 83 and the fourth upper side 84 facing each other may be inclined to each other and meet at an eighth point C8. An extension line 81e of the third lower side 81 may meet an extension line 82e of the fourth lower side 82 at a ninth point C9, and the ninth point C9 and the eighth point C8 may be connected by a sixth segment SL6 (or a sixth line SL6). The sixth segment SL6 may have a fifth length L5. The fifth segment SL5 and the sixth segment SL6 may intersect each other at a tenth point C10, which is substantially located at a center point of the sixth segment SL6. A distance L6 (hereinafter, a sixth length) from the eighth point C8 to the tenth point C10 may be about 0.5 times the fifth length L5.

In the present embodiments, the third angle θ3 may be smaller than the first angle θ1 of FIG. 5. The fourth length L4 may be greater than the first length L1. Therefore, while shapes of the first and second source/drain patterns SD1 and SD2 may be the same, their sizes, e.g., widths, may be different. That is, when measured in the first direction X, the largest width of the first source/drain pattern SD1 on the first region AR1 may be smaller than that of the second source/drain pattern SD2 on the second region AR2.

The semiconductor device of FIGS. 18 to 21 may be fabricated by a method similar to that described with reference to FIGS. 6 to 10. However, when the first recessed region R1 and the first source/drain pattern SD1 are formed on the first region AR1, the second region AR2 may be veiled by a mask pattern. The first recessed region R1 may be formed by an anisotropic etching process. The first source/drain pattern SD1 may be formed of, e.g., a silicon epitaxial layer. During the formation of the first source/drain pattern SD1, the first source/drain pattern SD1 may be doped in situ with, e.g., phosphorus. In certain embodiments, an ion implantation process may be further performed to inject dopants (e.g., phosphorus) into the first source/drain pattern SD1, after the formation of the first source/drain pattern SD1.

Alternatively, when the second recessed region R2 and the second source/drain pattern SD2 are formed on the second region AR2, the first region AR1 may be covered with a mask pattern. The second recessed region R2 may be formed by an isotropic etching process. In some embodiments, the side surface of the second active fin AF2 below the second gate electrode GE2 may be recessed in a direction (e.g., the first direction X) crossing the second gate electrode GE2. The second source/drain pattern SD2 may be formed of, e.g., a silicon germanium epitaxial layer. During the formation of the second source/drain pattern SD2, the second source/drain pattern SD2 may be doped in situ with, boron. In certain embodiments, an ion implantation process may be further performed to inject dopants (e.g., boron) into the second source/drain pattern SD2, after the formation of the second source/drain pattern SD2.

FIGS. 22 to 25 are sectional views, each of which is taken along a line F-F' of FIG. 18 to illustrate a semiconductor device according to an embodiment.

Figure 22:
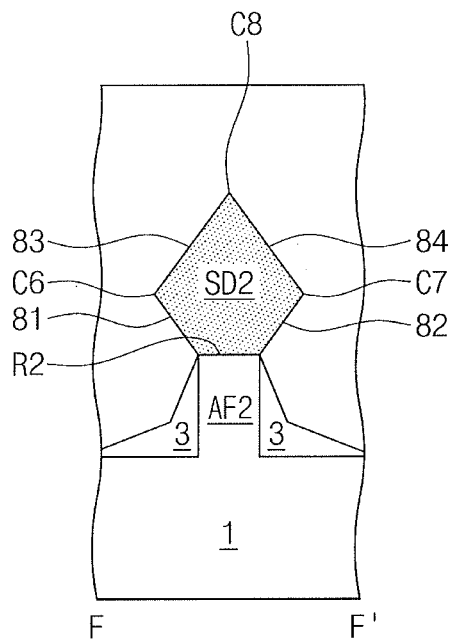
FIGS. 22 to 25 illustrate sectional views, each of which is along line F-F' of FIG. 18, of semiconductor devices according to embodiments.

Referring to FIG. 22, when viewed in the F-F' section, the top surface of the device isolation layer 3 may be recessed. For example, when the second recessed region R2 is formed, an upper portion of the device isolation layer 3 may be etched to form the recessed top surface. Here, the second source/drain pattern SD2 may have the same shape as that described with reference to FIG. 21.

Figure 23:
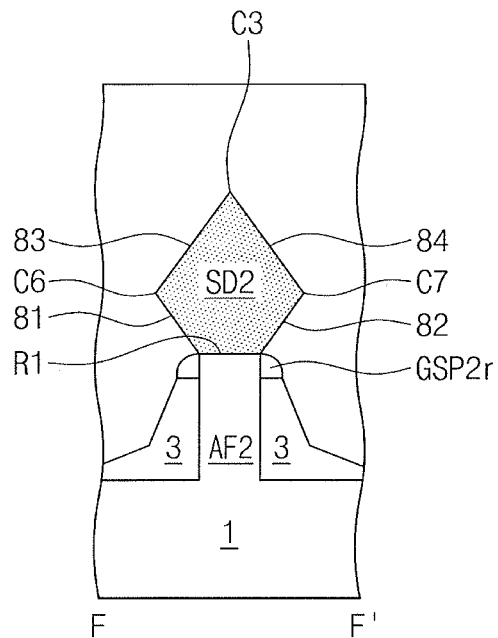

In certain embodiments, as shown in FIG. 23, a side surface of the second active fin AF2 below the second recessed region R2 may be covered with a second remaining gate spacer GSP2r. The bottom surface of the second recessed region R2 may be higher than the top surface of the device isolation layer 3. A top end of the second remaining gate spacer GSP2r may be located at the same level as the bottom surface of the second recessed region R2. Here, the second source/drain pattern SD2 may have the same shape as that described with reference to FIG. 21. However, the eighth point C8 of the second source/drain pattern SD2 may be located at a higher level than the eighth point C8 of FIG. 21. In this case, bottom ends of the third and fourth lower sides 81 and 82 of the second source/drain pattern SD2 may be located at the same level as the top end of the second remaining gate spacer GSP2r.

Figure 24:
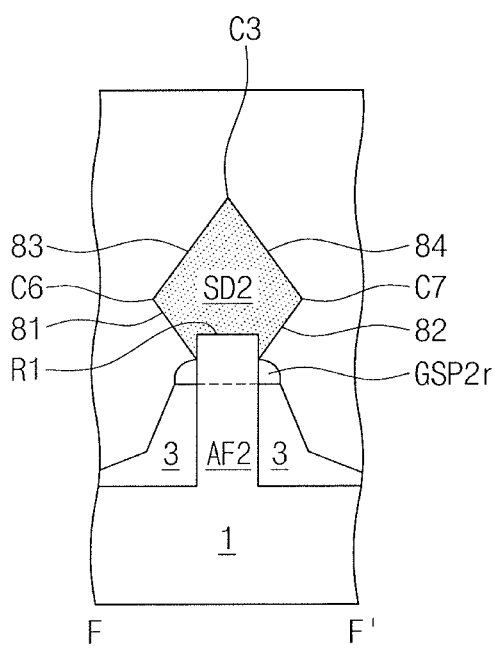

In certain embodiments, as shown in FIG. 24, the top end of the second remaining gate spacer GSP2r may be lower than the bottom surface of the second recessed region R2. A side surface of the second active fin AF2 below the bottom surface of the second recessed region R2 may be partially covered with the second source/drain pattern SD2. The bottom ends of the third and fourth lower sides 81 and 82 of the second source/drain pattern SD2 may be located at the same level as the top end of the second remaining gate spacer GSP2r. Other elements may be substantially the same as those of FIG. 23.

Figure 25:
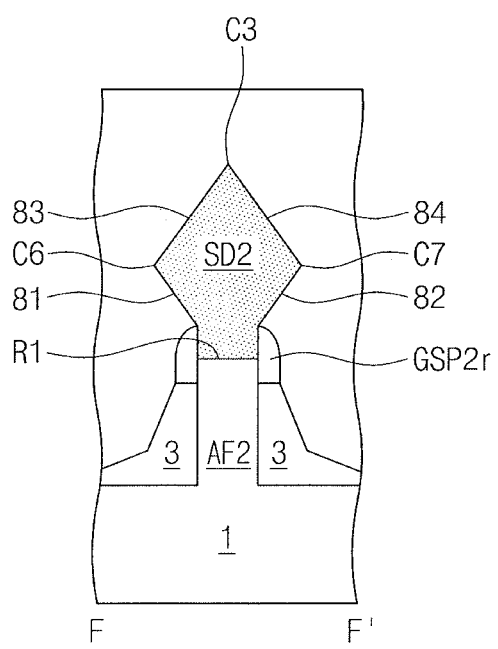

In certain embodiments, as shown in FIG. 25, the top end of the second remaining gate spacer GSP2r may be higher than the bottom surface of the second recessed region R2. The second source/drain pattern SD2 may include a lower portion that is extended between the second remaining gate spacers GSP2r and is in contact with the second active fin AF2. The lower portion of the second source/drain pattern SD2 may be covered with the second remaining gate spacers GSP2r. The bottom ends of the third and fourth lower sides 81 and 82 of the second source/drain pattern SD2 may be located at the same level as the top end of the second remaining gate spacer GSP2r. Other elements may be substantially the same as those of FIG. 23.

Figure 26:
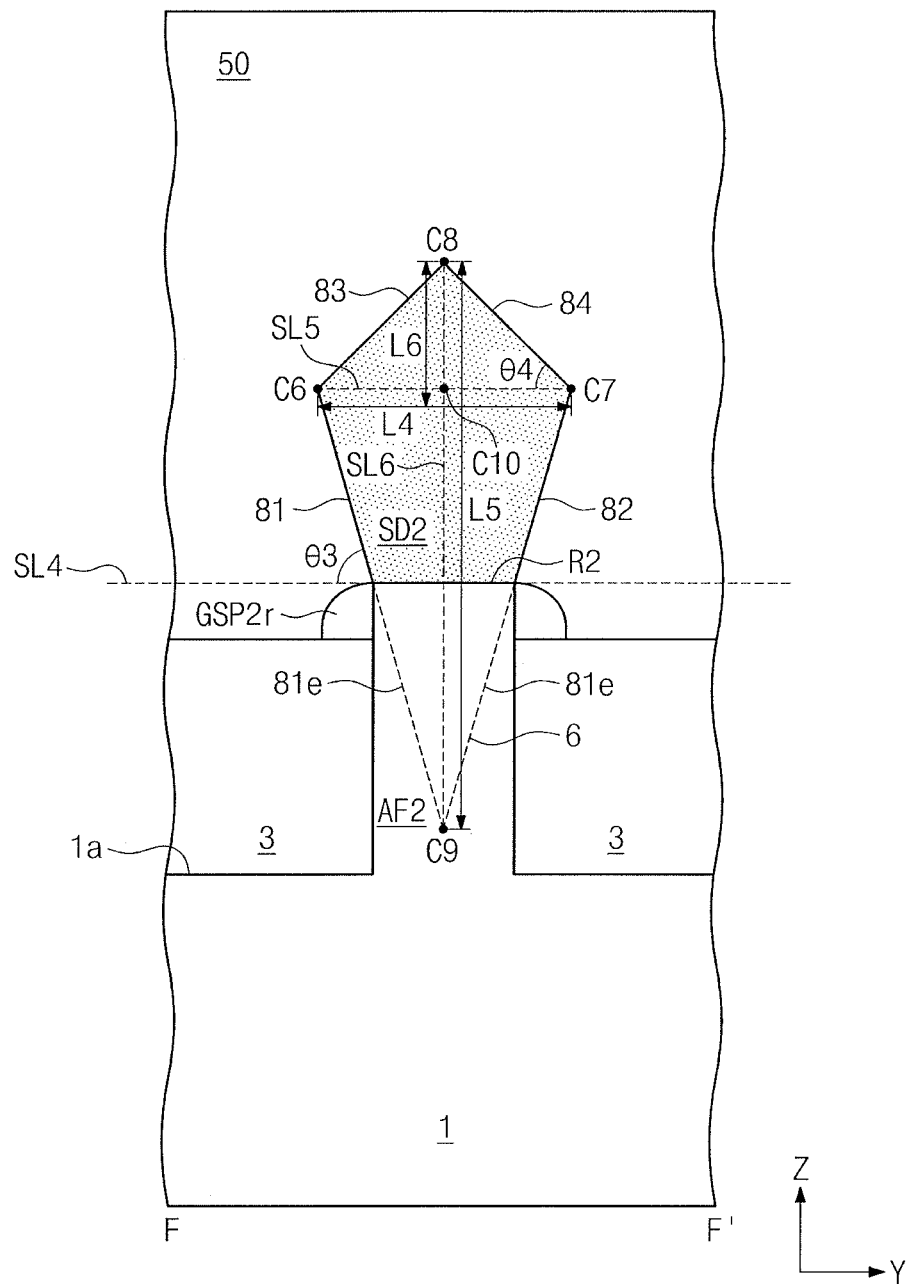
FIG. 26 illustrates an enlarged sectional view of a semiconductor device according to an embodiment, taken along line F-F' of FIG. 18.

FIG. 26 is an enlarged sectional view illustrating a semiconductor device according to an embodiment, taken along a line F-F' of FIG. 18. FIG. 26 illustrates another example of a section taken along line F-F' of FIG. 18. When taken along lines A-A', B-B', C-C', D-D', and E-E' of FIG. 18, the semiconductor device according to the present embodiment may have the same sections as those of FIGS. 19 and 20 and the description thereof will be omitted.

Referring to FIG. 26, a side surface of the second active fin AF2 below the second recessed region R2 may be covered with the second remaining gate spacer GSP2r. The bottom surface of the second recessed region R2 may be higher than the top surface of the device isolation layer 3. The second source/drain pattern SD2 may resemble the source/drain pattern SD described with reference to FIG. 5 in shape, e.g., but may be different in size (e.g., width). In other words, the third angle θ3 may be greater than the fourth angle θ4. The tenth point C10 may be located at a higher level than a center point of the sixth segment SL6. The sixth length L6 may be about 0.2 to about 0.45 times the fifth length L5. In the present embodiment, a height from the top surface of the device isolation layer 3 to the eighth point C8 may be substantially equal to the height from the top surface of the device isolation layer 3 to the third point C3, in the C-C' section of FIG. 19 or FIG. 5. Here, the fourth length L4 may be smaller than the first length L1. That is, in a semiconductor device including both of the first source/drain pattern SD1 of FIG. 19 (e.g., shown in the C-C' section) or FIG. 5 and the second source/drain pattern SD2 of FIG. 26, the first and second source/drain patterns SD1 and SD2 may have top ends that are located at the same height from the top surface of the device isolation layer 3, and the largest width of the first source/drain pattern SD1 in the first direction X may be greater than that of the second source/drain pattern SD2 in the first direction X.

Figure 27:
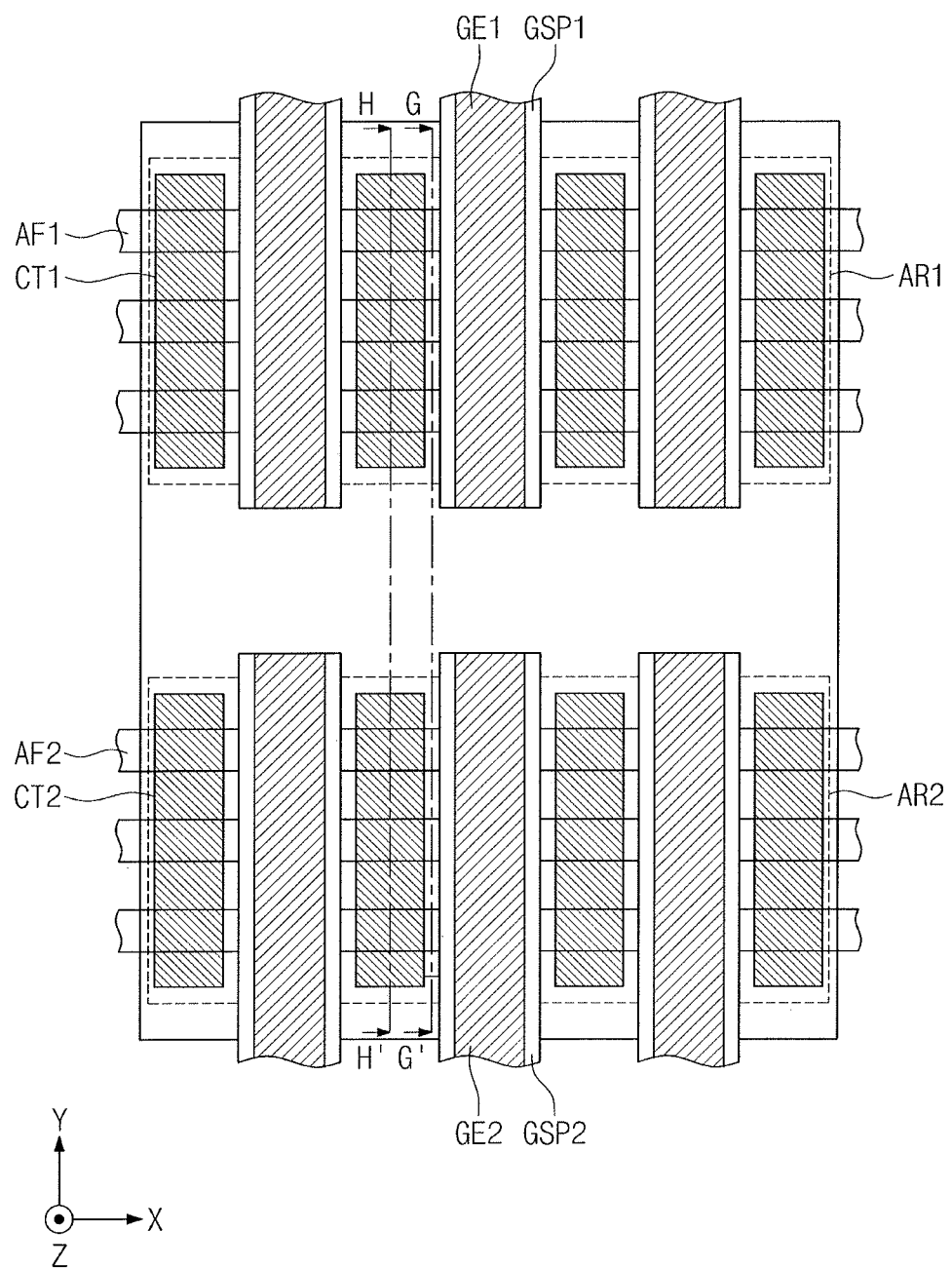
FIG. 27 illustrates a plan view of a semiconductor device according to an embodiment.
Figure 28:
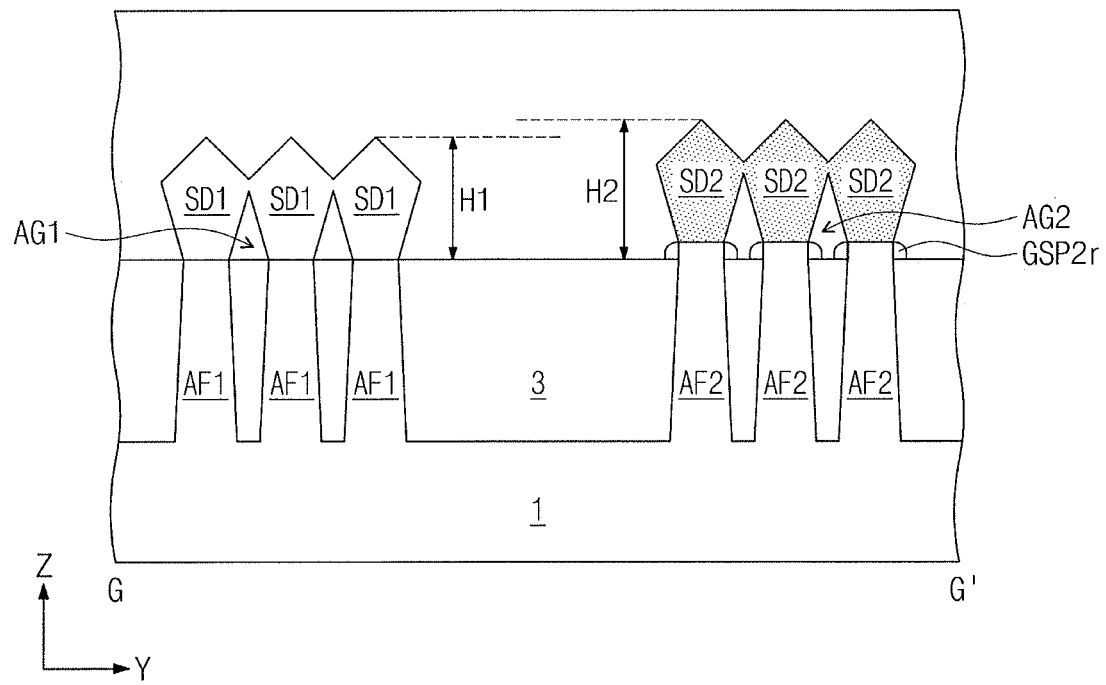
FIG. 28 illustrates a sectional view along line G-G' of FIG. 27.
Figure 29:
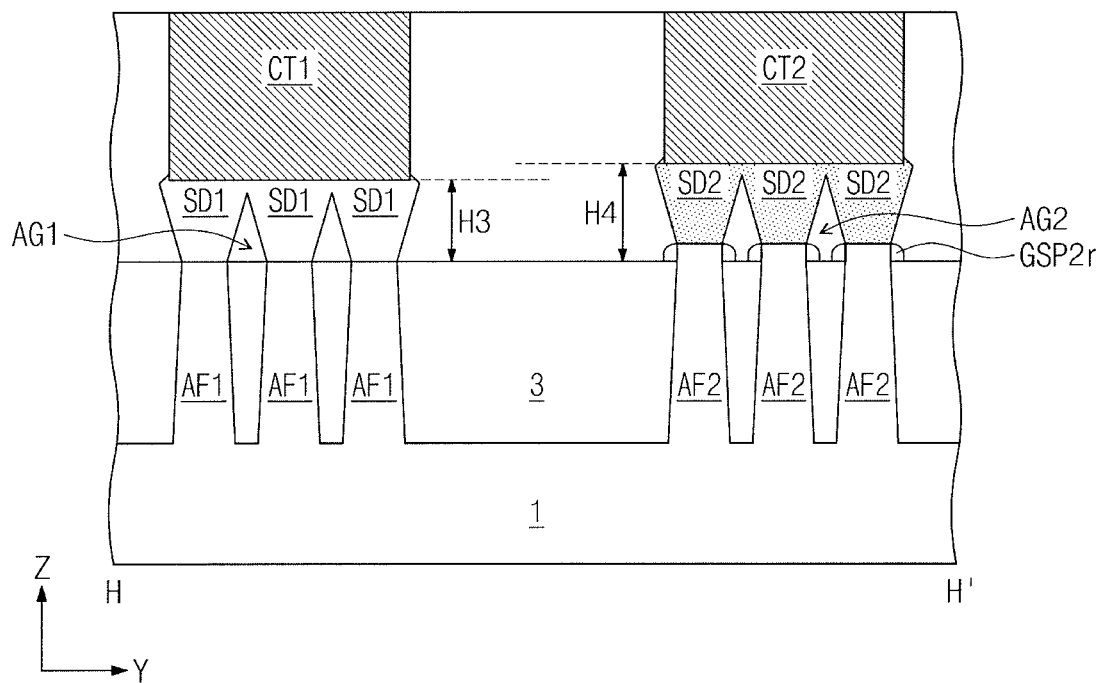
FIG. 29 illustrates a sectional view along line H-H' of FIG. 27.

FIG. 27 is a plan view illustrating a semiconductor device according to an embodiment. FIG. 28 is a sectional view taken along a line G-G' of FIG. 27. FIG. 29 is a sectional view taken along a line H-H' of FIG. 27.

Referring to FIGS. 27 to 29, a plurality of first active fins AF1 protruding from the substrate 1 may be provided on the first region AR1. A plurality of second active fins AF2 protruding from the substrate 1 may be provided on the second region AR2. The first region AR1 may be, e.g., an NMOS transistor region. The second region AR2 may be, e.g., a PMOS transistor region. When viewed in a plan view, the first active fins AF1 and the second active fins AF2 may be bar- or line-shaped patterns elongated in the first direction X. The first active fins AF1 and the second active fins AF2 may be spaced apart from each other by a specific space in the second direction Y crossing the first direction X. The first gate electrodes GE1 may cross the first active fins AF1 in the second direction Y. The second gate electrodes GE2 may cross the second active fins AF2 in the second direction Y. First source/drain patterns SD1 may be provided on exposed portions of the first active fins AF1 between the first gate electrodes GE1. The first source/drain patterns SD1 may be used as source/drain electrodes of an NMOS transistor. The first source/drain patterns SD1 may include a silicon epitaxial pattern, which is doped with phosphorus. Second source/drain patterns SD2 may be provided on exposed portions of the second active fins AF2 between the second gate electrodes GE2. The second source/drain patterns SD2 may be used as source/drain electrodes of a PMOS transistor. The second source/drain patterns SD2 may include a silicon germanium epitaxial pattern, which is doped with boron.

In FIG. 28, each of the first and second source/drain patterns SD1 and SD2 may resemble the source/drain pattern SD described with reference to FIG. 5 in shape. For example, as illustrated in FIG. 28, while shapes of the first and second source/drain patterns SD1 and SD2 may be the same, their sizes, e.g., heights along the Z direction, may be different. When measured in the second direction Y, the largest width of each of the first source/drain patterns SD1 may be substantially equal to the largest width of each of the second source/drain patterns SD2. Adjacent ones of the first source/drain patterns SD1 may be in contact with each other. In the case where the first source/drain patterns SD1 are provided to be adjacent to each other, there may be a difficulty in determining positions of the first point C1 and/or the second point C2 of FIG. 5 for each of the first source/drain patterns SD1. In this case, extension lines of the first lower side 41, the second lower side 42, the first upper side 43, and the second upper side 44 may be used to estimate positions of the first point C1 and/or the second point C2 of FIG. 5.

In FIG. 28, adjacent ones of the second source/drain patterns SD2 may be in contact with each other. In the case where the second source/drain patterns SD2 are provided to be adjacent to each other, there may be a difficulty in determining positions of the sixth point C6 and/or the seventh point C7 of FIG. 21 for each of the second source/drain patterns SD2. In this case, extension lines of the third lower side 81, the fourth lower side 82, the third upper side 83, and the fourth upper side 84 may be used to estimate positions of the sixth point C6 and/or the seventh point C7 of FIG. 21.

Unlike FIG. 28, adjacent ones of the first source/drain patterns SD1 may not be in contact with each other or may be spaced apart from each other. In addition, adjacent ones of the second source/drain patterns SD2 may not be in contact with each other or may be spaced apart from each other.

The upper side surface of the second active fins AF2 below the second source/drain patterns SD2 may protrude from the top surface of the device isolation layer 3 and may be covered with the second remaining gate spacer GSP2r. In FIG. 28, a first height H1 from a top end of the device isolation layer 3 to top ends of the first source/drain patterns SD1 may be smaller than a second height H2 from the top end of the device isolation layer 3 to top ends of the second source/drain patterns SD2. A difference between the second height H2 and the first height H1 may correspond to a vertical length of the second remaining gate spacer GSP2r.

Referring to FIGS. 27 and 29, a first contact plug CT1 may be provided on the first source/drain patterns SD1. A second contact plug CT2 may be provided on the second source/drain patterns SD2. When measured from the top end of the device isolation layer 3, a third height H3 of a bottom surface of the first contact plug CT1 may be smaller than a fourth height H4 of a bottom surface of the second contact plug CT2. A width of the first contact plug CT1 in the second direction Y may be smaller than a sum of largest widths of the first source/drain patterns SD1 in the second direction Y. A width of the second contact plug CT2 in the second direction Y may be smaller than a sum of largest widths of the second source/drain patterns SD2 in the second direction Y. First empty spaces or first air gap regions AG1 may be formed between lower sides of the first source/drain patterns SD1. Second empty spaces or second air gap regions AG2 may be formed between lower sides of the second source/drain patterns SD2. Other elements may be substantially the same as or similar to those described above.

In FIG. 29, there may be a difficulty in determining positions of the first point C1 and/or the second point C2 of FIG. 5 for each of the first source/drain patterns SD1. In this case, the first lower side 41 and the first upper side 43 of the leftmost one of the first source/drain patterns SD1 may be used to estimate a position of the first point C1, and the second lower side 42 and the second upper side 44 of the rightmost one of the first source/drain patterns SD1 may be used to estimate a position of the second point C2. The positions of the first and second points C1 and C2 may be used to calculate the first angle and the second angle.

In FIG. 29, there may be a difficulty in determining positions of the sixth point C6 and/or the seventh point C7 of FIG. 26 for each of second source/drain patterns SD2. In this case, the third lower side 81 and the third upper side 83 of the leftmost one of the second source/drain patterns SD2 may be used to estimate a position of the sixth point C6, and the fourth lower side 82 and the fourth upper side 84 of the rightmost one of the second source/drain patterns SD2 may be used to estimate a position of the seventh point C7. The positions of the sixth and seventh points C6 and C7 may be used to calculate the third angle and the fourth angle.

Figure 30:
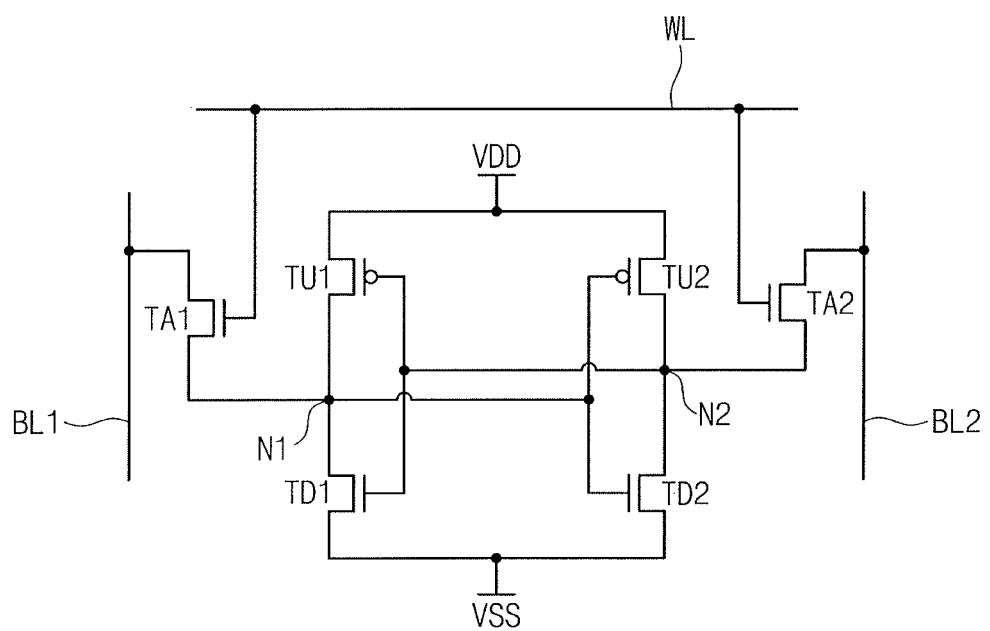
FIG. 30 illustrates an equivalent circuit diagram of a SRAM cell according to an embodiment.

FIG. 30 is an equivalent circuit diagram of a static random access memory (SRAM) cell according to an embodiment.

Referring to FIG. 30, an SRAM cell according to an embodiment may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors. The first and second pull-down transistors TD1 and TD2 and the first and second access transistors TA1 and TA2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line VDD, and a second source/drain of the first pull-down transistor TD1 may be connected to a ground line VSS. A gate of the first pull-up transistor TU1 and a gate of the first pull-down transistor TD1 may be electrically connected to each other. The first pull-up transistor TU1 and the first pull-down transistor TD1 may constitute a first inverter. The connected gates of the first pull-up transistor TU1 and the first pull-down transistor TD1 may correspond to an input terminal of the first inverter, and the first node N1 may correspond to an output terminal of the first inverter.

A first source/drain of the second pull-up transistor TU2 and a first source/drain of the second pull-down transistor TD2 may be connected to a second node N2. A second source/drain of the second pull-up transistor TU2 may be connected to the power line VDD, and a second source/drain of the second pull-down transistor TD2 may be connected to the ground line VSS. A gate of the second pull-up transistor TU2 and a gate of the second pull-down transistor TD2 may be electrically connected to each other. The second pull-up transistor TU2 and the second pull-down transistor TD2 may constitute a second inverter. The connected gates of the second pull-up transistor TU2 and the second pull-down transistor TD2 may correspond to an input terminal of the second inverter, and the second node N2 may correspond to an output terminal of the second inverter.

The first and second inverters may be combined to constitute a latch structure. In other words, the gates of the first pull-up transistor TU1 and the first pull-down transistor TD1 may be electrically connected to the second node N2, and the gates of the second pull-up transistor TU2 and the second pull-down transistor TD2 may be electrically connected to the first node N1. A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. Gates of the first and second access transistors TA1 and TA2 may be electrically coupled to a word line WL. This structure is just an example of the SRAM cell according to an embodiment, which is not limited to this example.

Figure 31:
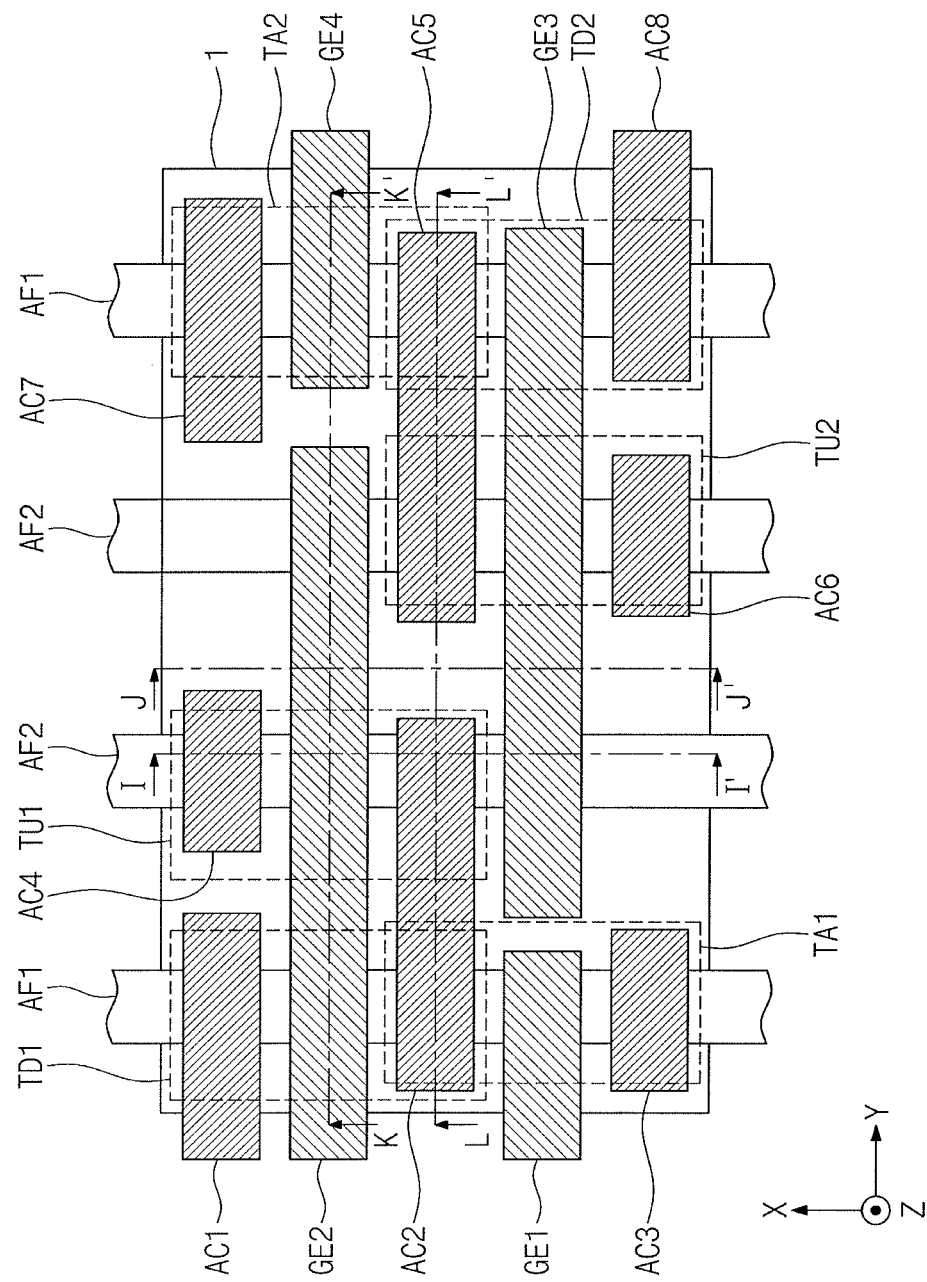
FIG. 31 illustrates a plan view of a semiconductor device (e.g., including the SRAM cell of FIG. 30) according to an embodiment.
Figure 32:
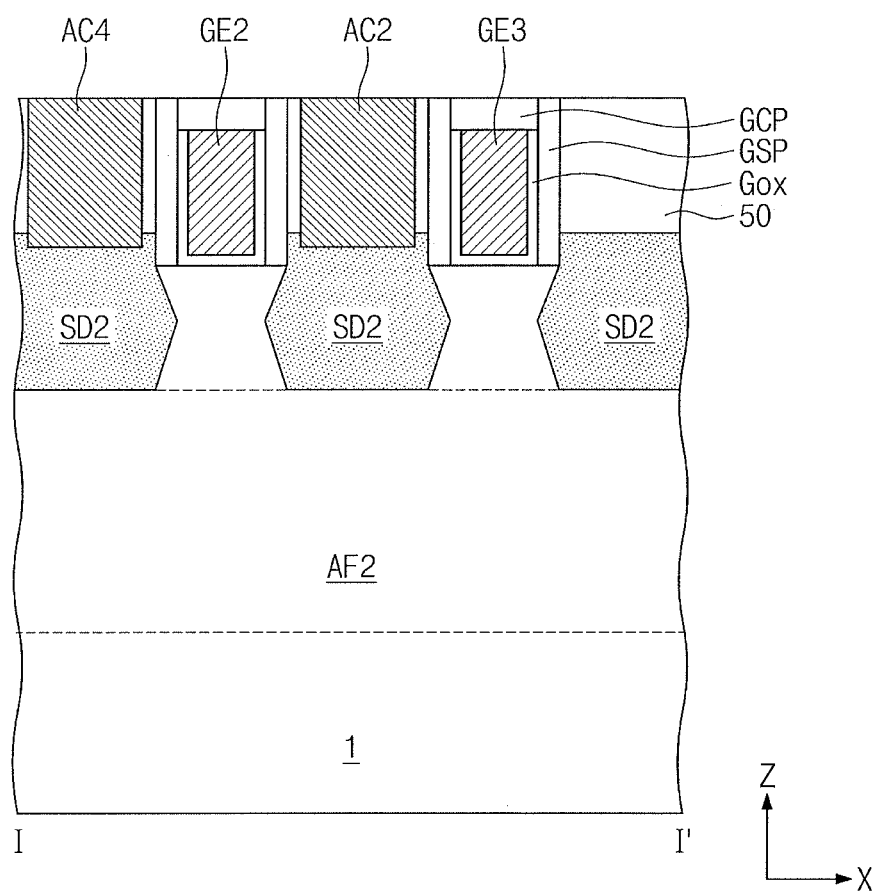
FIGS. 32 to 35 illustrate sectional views, which are respectively taken along lines J-J', K-K', and L-L' of FIG. 31.
Figure 33:
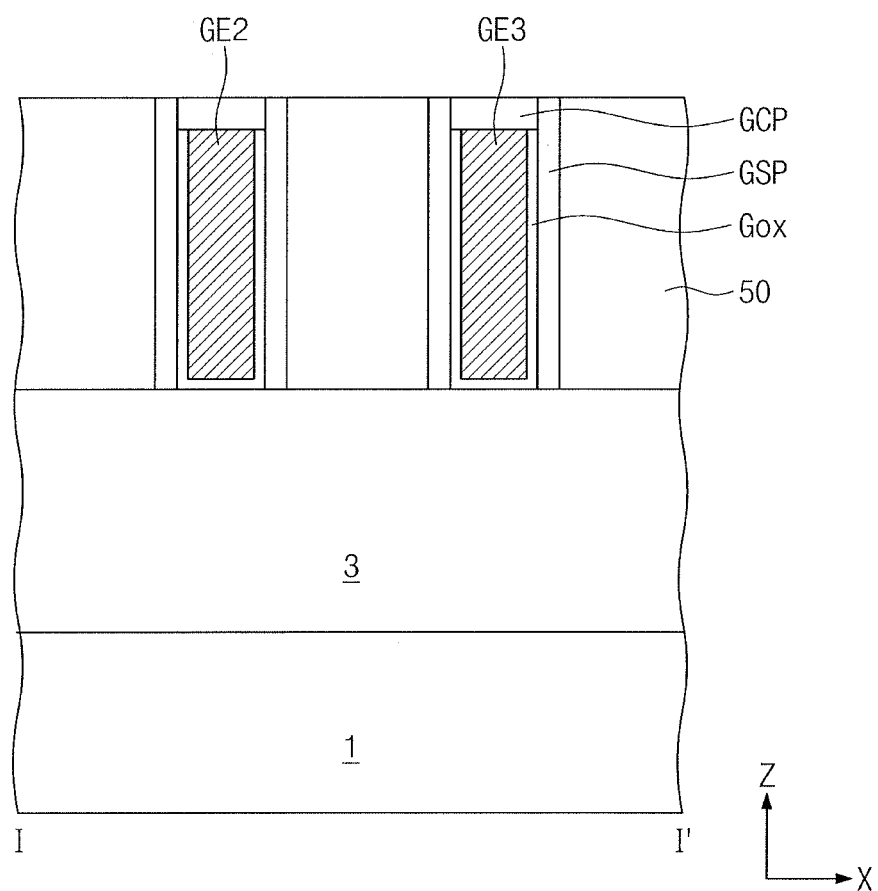
Figure 34:
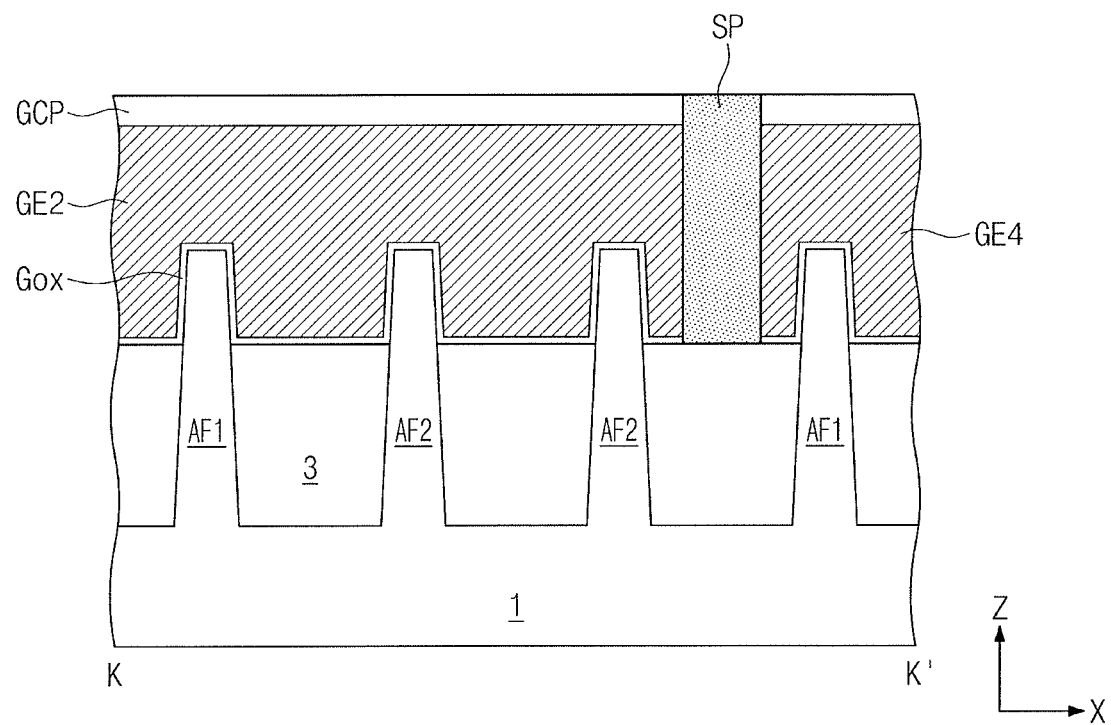
Figure 35:
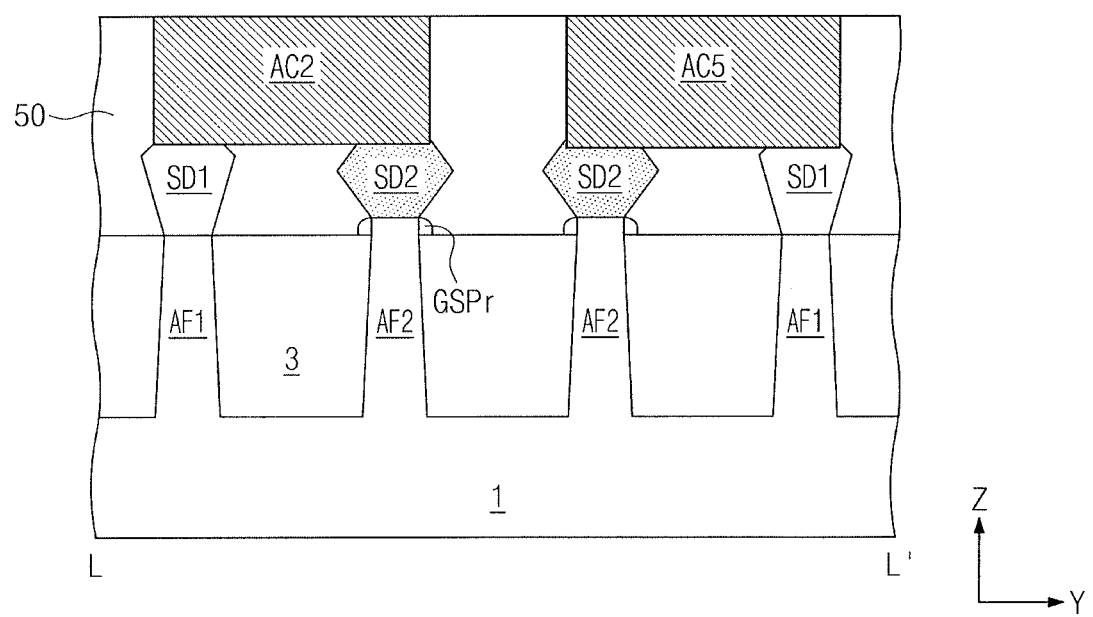

FIG. 31 is a plan view illustrating a semiconductor device (e.g., including the SRAM cell of FIG. 30) according to an embodiment. FIGS. 32 to 35 are sectional views, which are respectively taken along lines I-I', J-J', K-K', and L-L' of FIG. 31.

Referring to FIGS. 31 to 35, at least one SRAM cell may be provided on the substrate 1. The device isolation layer 3 may be provided on the substrate 1. The device isolation layer 3 may be placed to define the first and second active fins AF1 and AF2. First source/drain patterns SD1 may be provided on each of the first active fins AF1. Second source/drain patterns SD2 may be provided on each of the second active fins AF2. The first source/drain patterns SD1 may be used as source/drain electrodes of an NMOS transistor. The first source/drain patterns SD1 may be doped with n-type impurities. For example, the first source/drain patterns SD1 may include a silicon epitaxial pattern, which is doped with phosphorus. The second source/drain patterns SD2 may be used as source/drain electrodes of a PMOS transistor. Second source/drain patterns SD2 may be doped with p-type impurities. For example, the second source/drain patterns SD2 may include a silicon germanium epitaxial pattern, which is doped with boron.

First to fourth gate electrodes GE1-GE4 may be provided to cross the first and second active fins AF1 and AF2 and to extend in the second direction Y. The second gate electrode GE2 and the fourth gate electrode GE4 may be aligned to each other in the first direction X. A separation pattern SP may be interposed between the second gate electrode GE2 and the fourth gate electrode GE4 to separate them from each other. The first gate electrode GE1 and the third gate electrode GE3 may be aligned to each other in the first direction X. The separation pattern SP may be interposed between the first gate electrode GE1 and the third gate electrode GE3 to separate them from each other.

First to eighth active contacts AC1-AC8 may be provided at both sides of each of the first to fourth gate electrodes GE1-GE4. The first to eighth active contacts AC1-AC8 may penetrate an upper portion of the interlayered insulating layer 50 and may be coupled to the first and second source/drain patterns SD1 and SD2. Top surfaces of the first to eighth active contacts AC1-AC8 may be coplanar with a top surface of the interlayered insulating layer 50. The first to eighth active contacts AC1-AC8 may be formed of or include at least one of conductive metal nitrides (e.g., titanium nitride or tantalum nitride) or metallic materials (e.g., titanium, tantalum, tungsten, copper, or aluminum).

The first to fourth gate electrodes GE1-GE4 and the first and second source/drain patterns SD1 and SD2, which are respectively provided on the first and second active fins AF1 and AF2 around them, may constitute memory transistors. The memory transistors shown in FIG. 31 may include the first pull-up transistor TU1, the first pull-down transistor TD1, the second pull-up transistor TU2, the second pull-down transistor TD2, the first access transistor TA1, and the second access transistor TA2 previously described with reference to FIG. 30.

Referring back to FIG. 35, the first source/drain pattern SD1 of the first pull-down transistor TD1 and the second source/drain pattern SD2 of the first pull-up transistor TU1 may be spaced apart from each other in the second direction Y, and top surfaces thereof may be in contact with a second active contact AC2. The second source/drain pattern SD2 of the first pull-up transistor TU1 and the second source/drain pattern SD2 of the second pull-up transistor TU2 may be spaced apart from each other in the second direction Y. The second source/drain pattern SD2 of the second pull-up transistor TU2 and the first source/drain pattern SD1 of the second pull-down transistor TD2 may be spaced apart from each other in the second direction Y, and top surfaces of them may be in contact with a fifth active contact AC5. A width of each of the second and fifth active contacts AC2 and AC5 in the second direction Y may be greater than the largest width of the widest one of the first and second source/drain patterns SD1 and SD2 in the second direction Y.

In the present embodiments, each of the first source/drain patterns SD1 may resemble the source/drain pattern SD described with reference to FIG. 5, in shape. However, the first source/drain patterns SD1 may have a structure that is the same as or similar to one of the source/drain patterns SD described with reference to FIGS. 11 to 14. Each of the second source/drain patterns SD2 may resemble the second source/drain pattern SD2 described with reference to FIG. 23 in shape. However, the second source/drain patterns SD2 may have a structure that is the same as or similar to one of the second source/drain patterns SD2 described with reference to FIGS. 21, 22, and 24-26 or the source/drain patterns SD described with reference to FIGS. 11-14. Adjacent ones of the first and second source/drain patterns SD1 and SD2 may be spaced apart from each other. According to some embodiments, at least the first source/drain patterns SD1 may have the structure of FIG. 5, and in this case, it may be possible to reduce the largest width in the second direction Y. Thus, the distance between the first and second source/drain patterns SD1 and SD2 may be increased, and thus, it may be possible to prevent a bridge or short issue between the first and second source/drain patterns SD1 and SD2. This effect may become more and more important, as an integration density of a semiconductor device increases.

Figure 36:
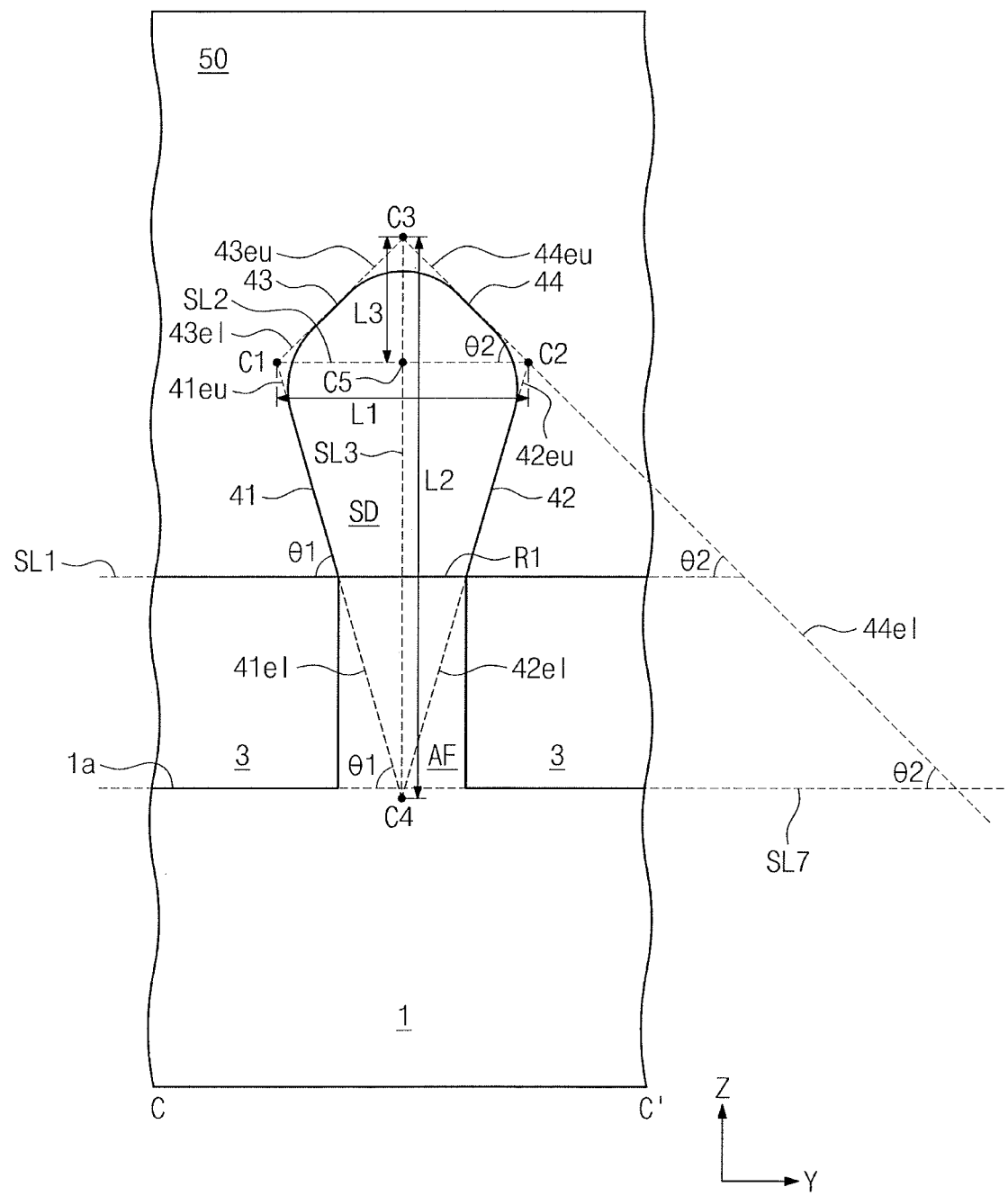
FIG. 36 illustrates a sectional view of a semiconductor device including a source/drain pattern according to an embodiment.

FIG. 36 is a sectional view of a semiconductor device including a source/drain pattern according to an embodiment. FIG. 36 illustrates a modified embodiment of FIG. 5.

Referring to FIG. 36, side and top portions of the source/drain pattern SD according to an embodiment may have a rounded shape. In other words, the first point C1 may correspond to a point where a lower extension line 43el of the first upper side 43 meets an upper extension line 41eu of the first lower side 41. The second point C2 may correspond to a point where the second upper side 44 meets an upper extension line 42eu of the second lower side 42. The third point C3 may correspond to a point where an upper extension line 43eu of the first upper side 43 meets an upper extension line 44eu of the second upper side 44. The fourth point C4 may correspond to a point where a lower extension line 41el of the first lower side 41 meets a lower extension line 42el of the second lower side 42. The first to fourth points C1, C2, C3, and C4 may not be located on or in the source/drain pattern SD. The laterally most protruding points of the source/drain pattern SD may be spaced apart from the first and second points C1 and C2. The topmost point of the source/drain pattern SD may be lower than the third point C3.

In the present embodiments, the first angle θ1 may be an angle between the first line SL1, which connects the bottom ends of the first and second lower sides 41 and 42 and is outwardly extended, and the first lower side 41. The first line SL1 may be parallel to the seventh line SL7, which is an extension line of the top surface 1a of the substrate 1. The first angle θ1 may correspond to an angle between the lower extension line 41el of the first lower side 41 and the seventh line SL7. In other words, the first angle θ1 may correspond to an angle between the first lower side 41 and the top surface 1a of the substrate 1.

In the present embodiments, the second angle θ2 may correspond to an angle between the second segment SL2, which connects the first point C1 to the second point C2, and the second upper side 44 or a lower extension line 44el of the second upper side 44. The first line SL1 may be parallel to the second segment SL2. The second angle θ2 may correspond to an angle between the first line SL1 and the lower extension line 44el of the second upper side 44. In certain embodiments, the second angle θ2 may correspond to an angle between the seventh line SL7 and the lower extension line 44el of the second upper side 44. The second angle θ2 may correspond to an angle between the second upper side 44 and the top surface 1a of the substrate 1. Except for the afore-described differences, the embodiments of FIG. 36 may be the same as or similar to that described with reference to FIG. 5.

Figure 37:
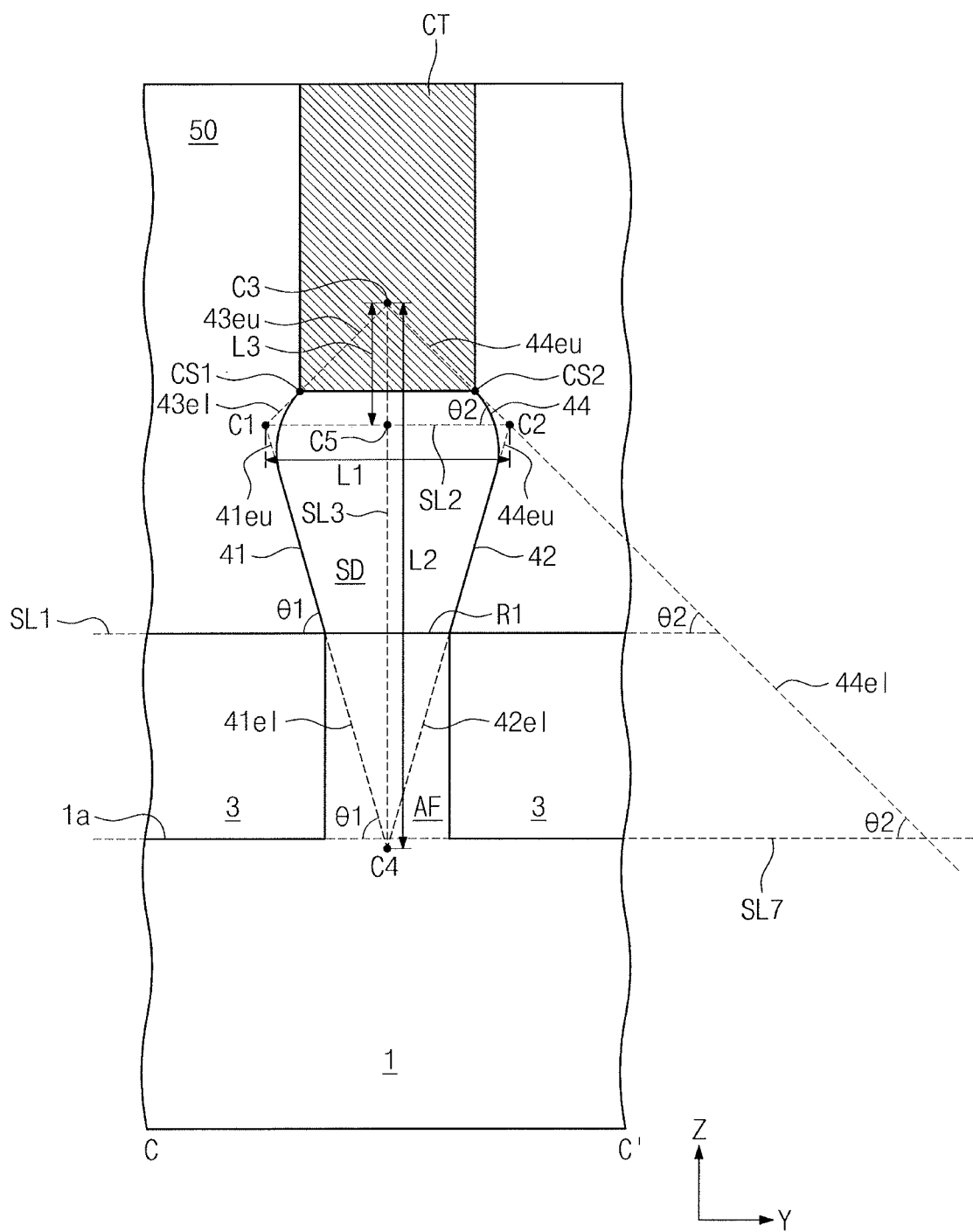
FIG. 37 illustrates a sectional view of a semiconductor device including a source/drain pattern according to an embodiment.

FIG. 37 is a sectional view of a semiconductor device including a source/drain pattern according to an embodiment. FIG. 37 illustrates a modified embodiment of FIG. 17.

Referring to FIG. 37, the interlayered insulating layer 50 and an upper portion of the source/drain pattern SD may be removed from the semiconductor device described with reference to FIG. 36 to form a contact hole, and then, the contact plug CT may be formed by filling the contact hole with a conductive layer. Here, a bottom surface of the contact plug CT may be higher than the fifth point C5. Top portions of the first upper side 43 and the second upper side 44 of the source/drain pattern SD may be removed during the forming of the contact plug CT. A first contact point CS1 may be defined as a point where the contact plug CT meets the first upper side 43, and a second contact point CS2 may be defined as a point where the contact plug CT meets the second upper side 44. The upper extension line 43eu and the lower extension line 43el of the first upper side 43 may be referred to as tangent lines 43eu and 43el at the first contact point CS1. In addition, the upper extension line 44eu and the lower extension line 44el of the second upper side 44 may be referred to as tangent lines 44eu and 44el at the second contact point CS2. Except for the afore-described differences, the embodiments of FIG. 37 may be the same as or similar to that described with reference to FIGS. 36 and 17.

According to some embodiments, a source/drain pattern may have a bottom angle of about 55° to about 65° with respect to a bottom of the substrate, and a top center line that is about 20-45% of a total center line length. Thus, a semiconductor device may have a sufficient, e.g., increased, separation margin, allowing adjacent ones of source/drain patterns to be spaced apart from each other. This may make it possible to realize a semiconductor device with improved electric characteristics and an increased integration density.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a first active fin protruding from a substrate;
    a second active fin protruding from the substrate;
    a first gate pattern crossing over both the first active fin and the second active fin;
    a first source/drain pattern of a first conductivity on the first active fin;

a second source/drain pattern of a second conductivity on the second active fin, the second conductivity being opposite to the first conductivity; and a contact plug in direct contact with both the first source/drain pattern of the first conductivity and the second source/drain pattern of the second conductivity, an entire bottom surface of the contact plug being flat, wherein the first source/drain pattern includes:
    a first lower side and a second lower side spaced apart from each other
    a first upper side extended from the first lower side,
    a second upper side extended from the second lower side, and
    a first side corner where the first lower side and the first upper side meet, wherein the second source/drain pattern includes:
    a third lower side and a fourth lower side spaced apart from each other,
    a third upper side extended from a top end of the third lower side
    a fourth upper side extended from the fourth lower side, and
    a second side corner where the third lower side and the third upper side meet, wherein the first lower side is inclined at a first angle relative to a top surface of the substrate, wherein the second upper side is inclined at a second angle relative to the top surface of the substrate, wherein the third lower side is inclined at a third angle relative to the top surface of the substrate, wherein the first angle is greater than the second angle and the third angle, wherein a level of the first side corner is higher than a level of the second side corner from the top surface of the substrate, and wherein top surfaces of the first and second source/drain patterns are coplanar with each other, the top surfaces of the first and second source/drain patterns being in direct contact with the bottom surface of the contact plug.

2. The semiconductor device as claimed in claim 1, wherein the first angle ranges from about 55° to about 65°.

3. The semiconductor device as claimed in claim 1, further comprising:
    a first point where the first lower side and the first upper side meet or an extension line of the first lower side and an extension line of the first upper side meet;
    a second point where the second lower side and the second upper side meet or an extension line of the second lower side and an extension line of the second upper side meet;
    a first imaginary segment along each of the first source/drain patterns connecting the first and second points to each other;
    a third point where the first upper side and the second upper side meet or an extension line of the first upper side and an extension line of the second upper side meet;
    a fourth point where an extension line of the first lower side and an extension line of the second lower side meet;
    a second imaginary segment along each of the first source/drain patterns connecting the third point to the fourth point; and
    a fifth point where the first imaginary segment and the second imaginary segment intersect, the fifth point being higher than a center point of the second imaginary segment.

4. The semiconductor device as claimed in claim 3, wherein a first distance from the third point to the fifth point is shorter than a distance from the fifth point to a level from which the first and second lower sides extend.

5. The semiconductor device as claimed in claim 1, wherein:
    the contact plug is in contact with both of the first upper side and the second upper side;
    a first contact point where the contact plug and the first upper side meet;
    a second contact point where the contact plug and the second upper side meet;
    a first tangential line at the first contact point;
    a second tangential line at the second contact point;
    a first point where the first tangential line and an extension line of the first lower side meet;
    a second point where the second tangential line and an extension line of the second lower side meet;
    a first imaginary segment along each of the first source/drain patterns connecting the first and second points to each other;
    a third point where the first tangential line and the second tangential line meet;
    a fourth point where an extension line of the first lower side and an extension line of the second lower side meet;
    a second imaginary segment along each of the first source/drain patterns connecting the third and fourth points to each other; and
    a fifth point where the first imaginary segment and the second imaginary segment intersect, the fifth point being higher than a center of the second imaginary segment.

6. The semiconductor device as claimed in claim 5, wherein a first distance from the third point to the fifth point is about 0.2 times to about 0.45 times a length of the second imaginary segment.

7. The semiconductor device as claimed in claim 1, wherein a width of the second source/drain pattern is larger than a width of the first source/drain pattern.

8. The semiconductor device as claimed in claim 1, wherein the fourth upper side is inclined at a fourth angle relative to the top surface of the substrate, the third angle being substantially equal to the fourth angle.

9. The semiconductor device as claimed in claim 1, wherein the first source/drain pattern and the first gate pattern constitute an NMOS transistor.

10. The semiconductor device as claimed in claim 1, further comprising:
    a spacer below the second source/drain pattern to cover a side surface of the second active fin.

11. The semiconductor device as claimed in claim 10, wherein a height of a top end of the first source/drain pattern is substantially equal to a height of a top end of the second source/drain pattern.

12. The semiconductor device as claimed in claim 10, wherein the fourth upper side is inclined at a fourth angle relative to the top surface of the substrate, and
    wherein the third angle is greater than the fourth angle.

13. The semiconductor device as claimed in claim 1, wherein the first source/drain pattern further includes:
    a first rounded edge between the first upper side and the first lower side; and a second rounded edge between the second upper side and the second lower side.

14. The semiconductor device as claimed in claim 1, further comprising a device isolation layer on the substrate, wherein:
   the device isolation layer exposes an upper sidewall of the second active fin; and
   the device further comprises a spacer covering the upper sidewall of the second active fin.

15. A semiconductor device, comprising:
   a first active fin protruding from a substrate;
   a second active fin protruding from the substrate;
   a third active fin protruding from the substrate;
   a fourth active fin protruding from the substrate, the first to fourth active fins being spaced apart from each other and sequentially arranged in a first direction;
   a first gate pattern crossing over the first to fourth active fins;
   first source/drain patterns of a first conductivity on the first active fin and the fourth active fin, respectively;
   second source/drain patterns of a second conductivity on the second active fin and the third active fin, respectively, the second conductivity being opposite to the first conductivity;
   a contact plug in direct contact with the first source/drain patterns and the second source/drain patterns, an entire bottom surface of the contact plug being flat; and
   spacers below the second source/drain patterns to cover a side surface of each of the second active fin and the third active fin,
   wherein the first source/drain pattern includes:
      a first lower side and a second lower side spaced apart from each other,
      a first upper side extended from the first lower side,
      a second upper side extended from the second lower side, and
      a first side corner where the first lower side and the first upper side meet,
   wherein the second source/drain pattern includes:
      a third lower side and a fourth lower side spaced apart from each other,
      a third upper side extended from a top end of the third lower side,
      a fourth upper side extended from the fourth lower side, and
      a second side corner where the third lower side and the third upper side meet,
   wherein the first lower side is inclined at a first angle relative to a top surface of the substrate,
   wherein the second upper side is inclined at a second angle relative to the top surface of the substrate,
   wherein the third lower side is inclined at a third angle relative to the top surface of the substrate,
   wherein the first angle is greater than the second angle and the third angle,
   wherein a level of the first side corner is higher than a level of the second side corner from the top surface of the substrate, and
      wherein top surfaces of the first and second source/drain patterns are coplanar with each other, the top surfaces of the first and second source/drain patterns being in direct contact with the bottom surface of the contact plug.

* * * * *